United States Patent
Harada et al.

(10) Patent No.: US 11,557,521 B2
(45) Date of Patent: Jan. 17, 2023

(54) HEAT SINK AND CIRCUIT DEVICE

(71) Applicant: Mitsubishi Electric Corporation, Tokyo (JP)

(72) Inventors: Keiji Harada, Tokyo (JP); Shuhei Mizutani, Tokyo (JP); Yoshihiro Taniguchi, Tokyo (JP); Masaki Takata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 9 days.

(21) Appl. No.: 16/638,233

(22) PCT Filed: Oct. 18, 2018

(86) PCT No.: PCT/JP2018/038781
§ 371 (c)(1),
(2) Date: Feb. 11, 2020

(87) PCT Pub. No.: WO2019/082783
PCT Pub. Date: May 2, 2019

(65) Prior Publication Data
US 2021/0378084 A1    Dec. 2, 2021

(30) Foreign Application Priority Data
Oct. 26, 2017    (JP) ............................. JP2017-207409

(51) Int. Cl.
*H05K 7/20*    (2006.01)
*F28F 1/12*    (2006.01)
(Continued)

(52) U.S. Cl.
CPC .......... *H01L 23/13* (2013.01); *H05K 1/0201* (2013.01); *H05K 1/0272* (2013.01);
(Continued)

(58) Field of Classification Search
None
See application file for complete search history.

(56) References Cited

U.S. PATENT DOCUMENTS

| | | |
|---|---|---|
| 5,016,090 A | 5/1991 | Galyon et al. |
| 5,331,510 A | 7/1994 | Ouchi et al. |
| | (Continued) | |

FOREIGN PATENT DOCUMENTS

| | | |
|---|---|---|
| JP | H05063385 A | 3/1993 |
| JP | 2003289124 A | 10/2003 |
| | (Continued) | |

OTHER PUBLICATIONS

Office Action dated May 7, 2021, issued in corresponding Chinese Patent Application No. 201880067076.2, 14 pages including 8 pages of English translation.
(Continued)

*Primary Examiner* — Courtney L Smith
(74) *Attorney, Agent, or Firm* — Buchanan Ingersoll & Rooney PC

(57) ABSTRACT

Provided are a heat sink capable of suppressing overcooling of an electronic component which should not be overcooled and highly efficiently cooling only an electronic component which should be cooled, and a circuit device including the same. A heat sink includes a pipe and a cooling block. At least one projection is formed in the cooling block. The pipe is in contact with the projection. The pipe is arranged with a spacing from a portion of the cooling block other than the projection.

10 Claims, 14 Drawing Sheets

(51) Int. Cl.
    *H01L 23/13*   (2006.01)
    *H05K 1/02*    (2006.01)
    *H02M 1/42*    (2007.01)

(52) U.S. Cl.
    CPC ..... *H05K 7/20163* (2013.01); *H05K 7/20336* (2013.01); *F28F 1/12* (2013.01); *H02M 1/4225* (2013.01); *H05K 2201/064* (2013.01); *H05K 2201/10416* (2013.01)

(56) References Cited

U.S. PATENT DOCUMENTS

| | | | | |
|---|---|---|---|---|
| 6,005,772 | A | 12/1999 | Terao et al. | |
| 6,665,187 | B1 | 12/2003 | Alcoe et al. | |
| 7,876,561 | B2* | 1/2011 | Schnetzka | F25B 49/025 |
| | | | | 361/699 |
| 7,885,071 | B2* | 2/2011 | Huang | H05K 7/20336 |
| | | | | 361/700 |
| 8,159,823 | B2* | 4/2012 | Murakami | F28F 3/12 |
| | | | | 361/716 |
| 2004/0057214 | A1 | 3/2004 | Alcoe et al. | |
| 2006/0012034 | A1* | 1/2006 | Kadoya | H05K 7/20872 |
| | | | | 257/712 |
| 2006/0181851 | A1 | 8/2006 | Frank et al. | |
| 2007/0258213 | A1 | 11/2007 | Chen et al. | |
| 2008/0035310 | A1 | 2/2008 | Hsu | |
| 2008/0084668 | A1 | 4/2008 | Campbell et al. | |
| 2011/0203773 | A1 | 8/2011 | Teraki et al. | |
| 2014/0140118 | A1* | 5/2014 | Ishikawa | H05K 7/20927 |
| | | | | 363/141 |
| 2015/0082823 | A1* | 3/2015 | Teraki | H05K 7/20254 |
| | | | | 361/699 |
| 2015/0116942 | A1* | 4/2015 | Teraki | F28D 15/0275 |
| | | | | 361/702 |
| 2016/0231008 | A1* | 8/2016 | Park | F24F 1/24 |
| 2018/0187905 | A1* | 7/2018 | Doi | H05K 1/0203 |

FOREIGN PATENT DOCUMENTS

| | | |
|---|---|---|
| JP | 2004056126 A | 2/2004 |
| JP | 2004336929 A | 11/2004 |
| JP | 2009295916 A | 12/2009 |
| JP | 4766283 B2 | 9/2011 |
| JP | 2013232526 A | 11/2013 |
| JP | 2015-127622 A | 7/2015 |
| WO | 2017013951 A1 | 1/2017 |

OTHER PUBLICATIONS

International Search Report (PCT/ISA/210), with translation, and Written Opinion (PCT/ISA/237) dated on Jan. 15, 2019, by the Japan Patent Office as the International Searching Authority for International Application No. PCT/JP2018/038781.
Office Action (Notice of Reasons for Refusal) dated Mar. 23, 2021, in corresponding Japanese Patent Applicatior No. 2019-551069 and English translation of the Office Action. (9 pages).
Office Action dated Jan. 18, 2022, issued in the corresponding Chinese Patent Application No. 201880067076.2, 11 pages including 7 pages of English Translation.
Examination Report under Section 18(3) dated Feb. 24, 2022, issued in the corresponding United Kingdom Patent Application No. 2004096.0, 4 pages.
Office Action dated Nov. 1, 2021, in corresponding Chinese Patent Application No. 201880067076.2 and English translation of the Office Action. (11 pages).
Office Action dated Oct. 14, 2021, in corresponding British Patent Application No. GB2004096.0. (6 pages).
Office Action dated Apr. 15, 2022, issued in the corresponding Chinese Patent Application No. 201880067076.2, 14 pages including 10 pages of English Translation.
Office Action issued in CN Application No. 201880067076.2; dated Oct. 13, 2022. 19 Pages (with Translation).

* cited by examiner

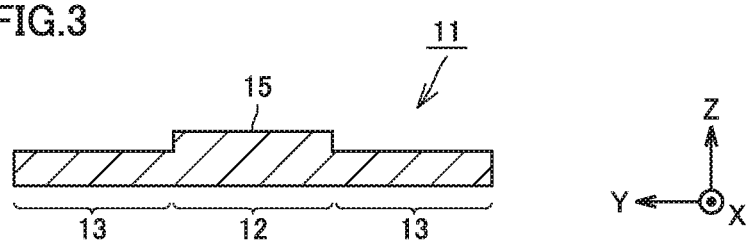
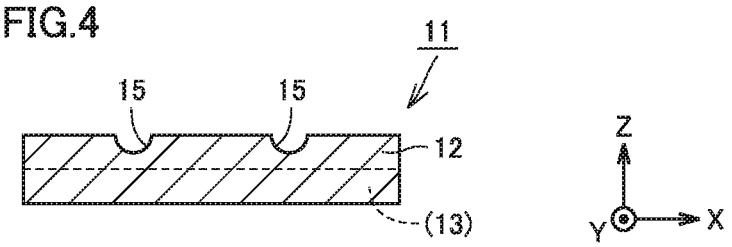
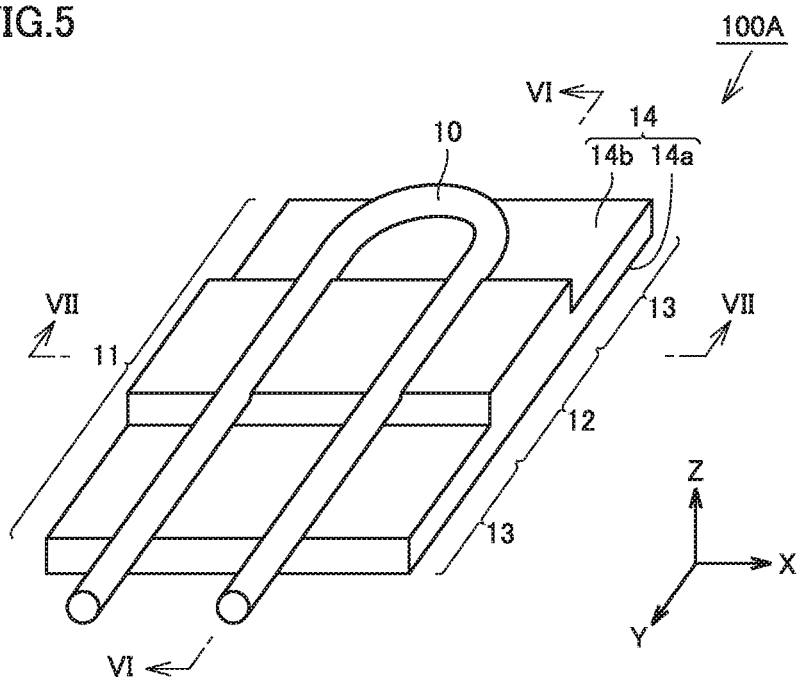

HEAT SINK AND CIRCUIT DEVICE

TECHNICAL FIELD

The present invention relates to a heat sink and a circuit device, and in particular to a heat sink including a pipe through which refrigerant flows, and a circuit device including an electronic component provided to a heat sink.

BACKGROUND ART

Conventionally, there has been provided a heat sink for cooling an electronic component, including a pipe through which a cooled fluid flows and a cooling block made of a thermally conductive material. Such a heat sink is disclosed for example in Japanese Patent Laying-Open No. 2013-232526 (PTL 1). The heat sink disclosed in Japanese Patent Laying-Open No. 2013-232526 has a configuration that a groove is formed in an upper surface of the cooling block and the pipe through which the cooled fluid flows is fitted in the groove. In Japanese Patent Laying-Open No. 2013-232526, the cooling block is cooled by the cooled fluid flowing through the pipe fitted in the groove. Thereby, a power module provided to be in contact with the cooling block is cooled.

CITATION LIST

Patent Literature

PTL 1: Japanese Patent Laying-Open No. 2013-232526

SUMMARY OF INVENTION

Technical Problem

In Japanese Patent Laying-Open No. 2013-232526, the groove for fitting the pipe therein is formed entirely in one direction with respect to plan view (for example, a depth direction) of the cooling block, which is a main body of the heat sink. Since the pipe is provided to be fitted in this groove, the entire region in the one direction in plan view of the cooling block is cooled. Thus, condensation may occur in an electronic component placed to be in contact with the cooling block due to overcooling, irrespective of at which portion in the one direction the electronic component is placed.

In addition, for example, a diode, which may be included in the electronic component, has an increased forward direction voltage when temperature decreases. Thus, it is preferable that the electronic component including the diode is not overcooled. However, in Japanese Patent Laying-Open No. 2013-232526, irrespective of at which portion in the one direction the electronic component including the diode is placed, the electronic component is cooled by the pipe, causing an increase in forward direction voltage. The increase in forward direction voltage leads to an increase in power loss and a decrease in efficiency of the diode.

The present invention has been made in view of the aforementioned problems, and an object thereof is to provide a heat sink capable of suppressing overcooling of an electronic component which should not be overcooled and highly efficiently cooling only an electronic component which should be cooled, and a circuit device including the same.

Solution to Problem

A heat sink in the present solution includes a pipe and a cooling block. At least one projection is formed in the cooling block. The pipe is in contact with the projection. The pipe is arranged with a spacing from a portion of the cooling block other than the projection.

A circuit device in the present solution includes the heat sink described above and an electronic component. The cooling block has a first surface in which the projection is formed, and a second surface opposite to the first surface. The electronic component is attached to the second surface.

Advantageous Effects of Invention

According to the present solution, the pipe is placed to be in contact with the projection in the cooling block, and the pipe is not in contact with the portion of the cooling block other than the projection. This can cool only a desired electronic component high efficiently and suppress overcooling of an electronic component other than that. In addition, the pipe is arranged to be spaced and keep a certain distance from the portion of the cooling block other than the projection, to be substantially parallel to the portion. This suppresses a physical interference between the pipe and the cooling block.

BRIEF DESCRIPTION OF DRAWINGS

FIG. 3 is a schematic cross sectional view of a portion along a line III-III in FIG. 2.

FIG. 4 is a schematic cross sectional view of a portion along a line IV-IV in FIG. 2.

FIG. 5 is a schematic perspective view of the entire heat sink in accordance with the first embodiment.

DESCRIPTION OF EMBODIMENTS

Hereinafter, embodiments will be described based on the drawings. It should be noted that an X direction, a Y direction, and a Z direction are introduced for convenience of description.

First Embodiment

Figure 1:
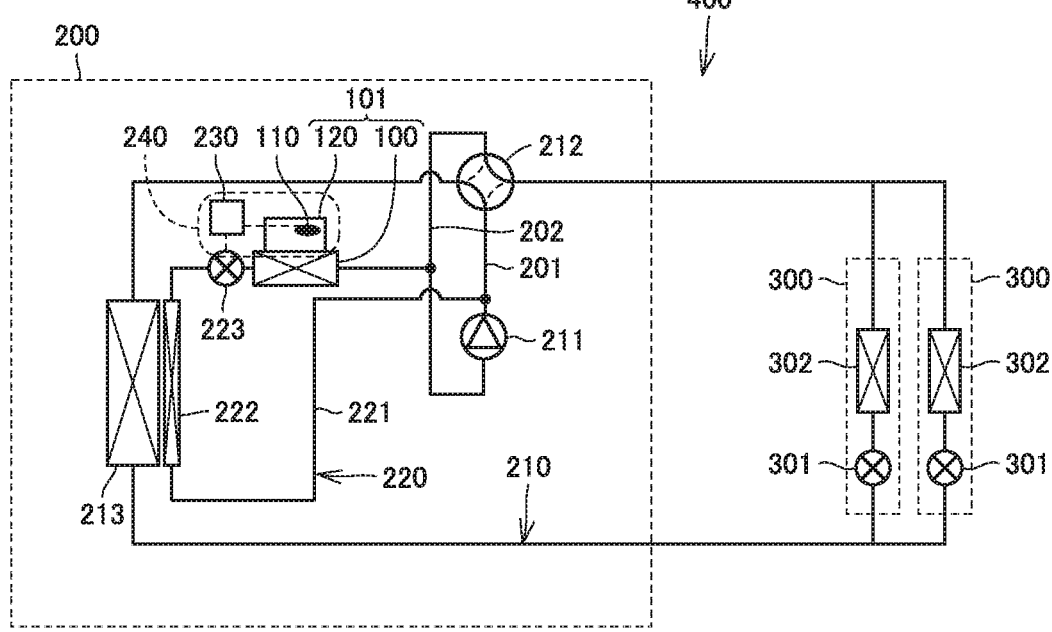
FIG. 1 is a circuit diagram showing a state where a heat sink and a circuit device including the same in accordance with a first embodiment are placed in an air conditioner.

FIG. 1 is a circuit diagram showing a state where a heat sink and a circuit device including the same in accordance with a first embodiment are placed in an air conditioner. An air conditioner 400 shown in FIG. 1 has a heat source unit 200 and a plurality of load units 300. Heat source unit 200 corresponds to an outdoor unit, for example, and each load unit 300 corresponds to an indoor unit, for example. A heat sink 100 and a circuit device 101 including the same in accordance with present embodiment are included in heat source unit 200.

Heat source unit 200 has a main circuit 210 and a bypass circuit 220. Of them, main circuit 210 mainly has a compressor 211, a flow path switching device 212, and a heat source-side heat exchanger 213. In addition, bypass circuit 220 has a control device 240, which will be described later. First, constituting members of main circuit 210 will be described.

Compressor 211 compresses and discharges refrigerant. Flow path switching device 212 is constituted by a four-way valve, for example, and switches flow paths of the refrigerant between during cooling operation and during heating operation. Heat source-side heat exchanger 213 performs heat exchange between air and the refrigerant discharged from compressor 211 and circulating through main circuit 210. Heat source-side heat exchanger 213 functions as a condenser during cooling operation, and functions as an evaporator during heating operation.

On the other hand, each load unit 300 has a load-side throttle device 301 and a load-side heat exchanger 302. It should be noted that, in FIG. 1, two load units 300 are connected in parallel to one heat source unit 200. However, any number of load units 300 may be connected to one heat source unit 200, and the number thereof may be only one, or may be three or more. Load-side throttle device 301 is constituted by an electronic expansion valve, a capillary tube, or the like, for example. Load-side throttle device 301 decompresses and expands the refrigerant flowing thereinto from heat source-side heat exchanger 213. Load-side heat exchanger 302 performs heat exchange between air and the refrigerant decompressed by load-side throttle device 301. Load-side heat exchanger 302 functions as an evaporator during cooling operation, and functions as a condenser during heating operation.

Compressor 211, flow path switching device 212, heat source-side heat exchanger 213, load-side throttle devices 301, and load-side heat exchangers 302 are connected by refrigerant pipes to constitute main circuit 210 of a refrigerant circuit. As the refrigerant flowing through main circuit 210, any one selected from the group consisting of water, fluorocarbon, ammonia, and carbon dioxide is used, for example.

Next, constituting members of bypass circuit 220 in heat source unit 200 will be described. Bypass circuit 220 has control device 240, and control device 240 has an electronic component 120 as a heat generating body, and a cooling controller 230 that controls cooling of electronic component 120 based on the temperature of electronic component 120. Namely, bypass circuit 220 is a circuit for cooling electronic component 120 as a heat generating body in control device 240, using the refrigerant.

In addition to the above members, bypass circuit 220 has a pre-cooling heat exchanger 222, a flow rate adjusting device 223, and heat sink 100. Pre-cooling heat exchanger 222 is constituted integrally with heat source-side heat exchanger 213. A portion of heat source-side heat exchanger 213 is used as pre-cooling heat exchanger 222. Pre-cooling heat exchanger 222 cools the refrigerant branching and flowing thereinto from main circuit 210. Flow rate adjusting device 223 is constituted by an opening degree-variable electronic expansion valve or the like, and decompresses and expands the refrigerant cooled by pre-cooling heat exchanger 222. Heat sink 100 cools heat-generating electronic component 120 included in control device 240, using cold energy of the refrigerant decompressed by flow rate adjusting device 223. In the following, electronic component 120 refers to a heat-generating electronic component, of a plurality of electronic components 120 constituting control device 240. It should be noted that the temperature of electronic component 120 can be detected by a temperature sensor 110. In addition, circuit device 101 is constituted by attaching electronic component 120 to heat sink 100.

In bypass circuit 220, pre-cooling heat exchanger 222, flow rate adjusting device 223, and heat sink 100 are connected by a bypass pipe 221. Here, a high pressure pipe 201 is connected between compressor 211 and flow path switching device 212, and a low pressure pipe 202 is connected to a suction side of compressor 211. Bypass pipe 221 branches from high pressure pipe 201 and is connected to low pressure pipe 202.

It should be noted that, in FIG. 1, flow rate adjusting device 223 is provided on an inlet side of heat sink 100 (the left side in FIG. 1). However, flow rate adjusting device 223 may be provided on an outlet side of heat sink 100 (the right side in FIG. 1). When flow rate adjusting device 223 is provided on the inlet side of heat sink 100 as in FIG. 1, the refrigerant cooled by pre-cooling heat exchanger 222 is decompressed at flow rate adjusting device 223, and flows into heat sink 100 with the temperature thereof being further decreased.

Control device 240 controls the frequency of compressor 211, switching of flow path switching device 212, the opening degree of load-side throttle device 301, and the like. In addition, cooling controller 230 included in control device 240 controls the opening degree of flow rate adjusting device 223 based on the temperature of electronic component 120 detected by temperature sensor 110. Specifically, when the temperature of electronic component 120 is more than or equal to an upper limit temperature, cooling controller 230 opens flow rate adjusting device 223 to cause the refrigerant to flow into bypass circuit 220. When the temperature of electronic component 120 is less than or equal to a lower limit temperature, cooling controller 230 closes flow rate adjusting device 223 to stop flowing of the refrigerant in bypass circuit 220. Here, the upper limit temperature of electronic component 120 corresponds to a heatproof temperature of electronic component 120, for example, and the lower limit temperature of electronic component 120 corresponds to a temperature at which condensation occurs in electronic component 120, for example.

The refrigerant discharged from compressor 211 flows through main circuit 210 and exchanges heat with the air in load units 300. Thereby, cooling or heating is performed. When the temperature of electronic component 120 increases to more than or equal to the upper limit temperature, cooling controller 230 controls flow rate adjusting device 223 to open. Thereby, a portion of a high pressure gas refrigerant discharged from compressor 211 flows into bypass pipe 221.

The high pressure gas refrigerant flowing into bypass pipe 221 is cooled by pre-cooling heat exchanger 222 and becomes a liquid refrigerant. The liquid refrigerant is decompressed by flow rate adjusting device 223 and flows into heat sink 100. The liquid refrigerant flowing into heat sink 100 absorbs heat generated by electronic component 120, becomes a gas refrigerant, and flows into bypass pipe 221. The gas refrigerant flowing out of heat sink 100 passes from bypass pipe 221 through low pressure pipe 202, and is suctioned therefrom into compressor 211. Compressor 211 compresses the gas refrigerant and thereby the gas refrigerant becomes a high pressure gas refrigerant.

On this occasion, when the temperature of electronic component 120 is more than or equal to the upper limit temperature, cooling controller 230 causes the refrigerant to flow into bypass circuit 220 to cool electronic component 120, and when the temperature of electronic component 120 is less than or equal to the lower limit temperature, cooling controller 230 stops flowing of the refrigerant into bypass circuit 220.

Heat sink 100 and circuit device 101 including the same in the circuit diagram of the air conditioner described above are heat sink 100 and circuit device 101 in the present embodiment. Next, a heat sink 100A as heat sink 100 in the present embodiment will be described using FIGS. 2 to 7.

Figure 2:
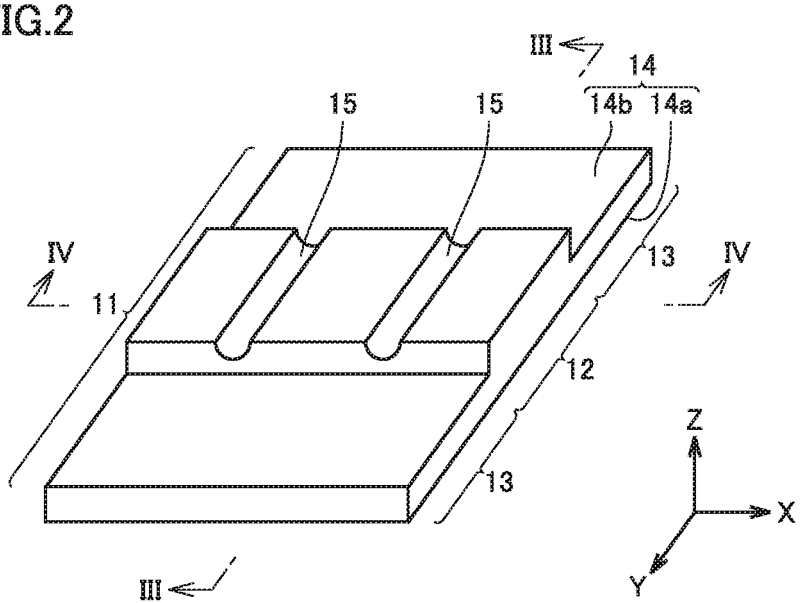
FIG. 2 is a schematic perspective view of a portion of a heat sink 100A in accordance with the first embodiment.

FIG. 2 is a schematic perspective view of a portion of heat sink 100A in accordance with the first embodiment. FIGS. 3 and 4 are schematic cross sectional views in which the configuration in FIG. 2 is viewed from respective directions. Referring to FIGS. 2 to 4, heat sink 100A in the present embodiment includes a cooling block 11. Cooling block 11 has a flat plate shape having a rectangular shape in an XY plane and having a thickness with respect to the Z direction. Cooling block 11 is made of a material having a good heat conductivity, such as aluminum or copper, for example.

At least one projection 12 is formed in cooling block 11. In the example in FIG. 2, one projection 12 is formed in cooling block 11. Projection 12 is a portion projecting upward in the Z direction, when compared with flat portions 13, which are portions of cooling block 11 other than the projection. That is, cooling block 11 has one main surface 14a (a lower side in the Z direction in FIG. 2) and the other main surface 14b (an upper side in the Z direction) opposite thereto as main surfaces 14, to extend along the XY plane. One main surface 14a is flatly formed to extend along the XY plane in its entirety. In contrast, the other main surface 14b projects upward in the Z direction in FIG. 2 at projection 12, when compared with flat portions 13. However, the other main surface 14b extends along one main surface 14a (the XY plane) at both projection 12 and flat portions 13.

Projection 12 is formed entirely in the X direction of cooling block 11. However, projection 12 is formed only at a central portion with respect to the Y direction of cooling block 11. With respect to the Y direction of cooling block 11, flat portions 13 are formed to sandwich projection 12 therebetween from both the front side and the back side of projection 12.

Groove portions 15 are formed in projection 12. Groove portions 15 extend along one direction in plan view, that is, the Y direction, of projection 12. Groove portions 15 are regions where the other main surface 14b at projection 12 is partially recessed downward in the Z direction. Groove portions 15 have a shape extending along the Y direction, for example. The dimension of projection 12 in the Y direction, which is the one direction in plan view, is shorter than the dimension of entire cooling block 11 in the Y direction. In other words, in cooling block 11, the dimension of the portion of projection 12 is shorter than the dimension of entire cooling block 11, with respect to the direction in which groove portions 15 extend.

As shown in FIGS. 2 and 4, each groove portion 15 has an arc shape in a cross section intersecting the Y direction in which groove portion 15 extends. That is, in this case, a surface forming groove portion 15 is curved. However, the shape of groove portion 15 is not limited thereto, and can be changed as appropriate according to the shape of a pipe described later. Groove portion 15 may have a portion of an elliptical shape, for example, in the cross section in FIG. 4.

Figure 6:
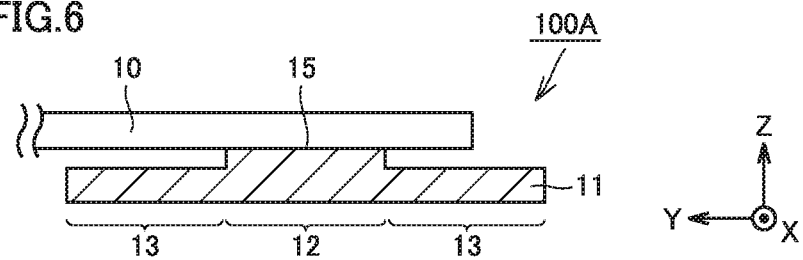
FIG. 6 is a schematic cross sectional view of a portion along a line VI-VI in FIG. 5.
Figure 7:
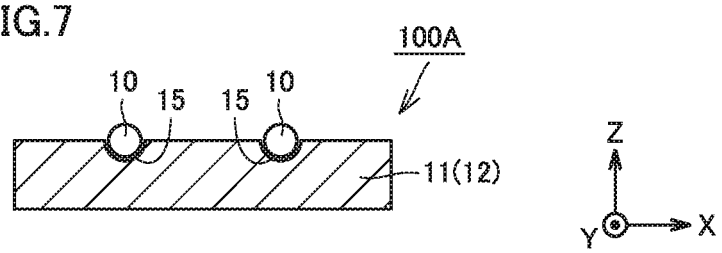
FIG. 7 is a schematic cross sectional view of a portion along a line VH-VH in FIG. 5.

FIG. 5 is a schematic perspective view of entire heat sink 100A in accordance with the first embodiment, in which a pipe is placed in the cooling block in FIG. 2. FIGS. 6 and 7 are schematic cross sectional views in which the configuration in FIG. 5 is viewed from respective directions. Referring to FIGS. 5 to 7, in heat sink 100A in the present embodiment, a pipe 10 is further placed in cooling block 11 in FIG. 2. Pipe 10 is a pipe through which the refrigerant flows. As shown in FIG. 5, pipe 10 has a U shape, for example, in plan view. As shown in FIGS. 5 and 7, the cross section of pipe 10 intersecting a direction in which pipe 10 extends (substantially the Y direction) has a circular shape, for example, but is not limited thereto. The cross section of pipe 10 may have an elliptical shape, or may have a rectangular shape or a square shape, for example. In addition, pipe 10 may have an M shape in plan view.

Pipe 10 is placed to be in contact with projection 12. Specifically, pipe 10 is placed such that a portion of the surface of pipe 10 is in contact with the curved surface of each groove portion 15 formed in projection 12. Pipe 10 is joined to groove portions 15 by brazing or the like. Thereby, pipe 10 is fitted in groove portions 15 and is in contact with projection 12.

As shown in FIG. 5, U-shaped pipe 10 is placed to substantially entirely overlap with a region where cooling block 11 is arranged, with respect to the Y direction. Namely, pipe 10 is placed to overlap with projection 12 of cooling block 11, and flat portions 13 arranged on one side and the other side thereof in the Y direction, in plan view. However, although pipe 10 is in contact with projection 12 at groove portions 15 as described above, pipe 10 is not in contact with flat portions 13. Namely, as shown in particular in FIG. 6, pipe 10 is arranged to be spaced and keep a distance from flat portions 13, which are portions of cooling block 11 other than projection 12 (more specifically, portions of flat portions 13 serving as the other main surface 14b), with respect to the Z direction. That is, pipe 10 is arranged with a spacing from flat portions 13.

Figure 8:
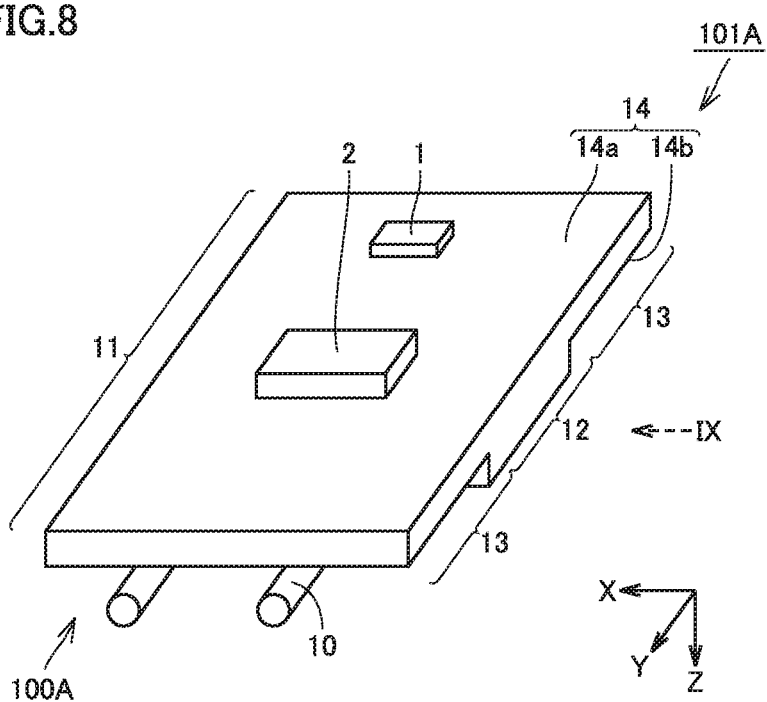
FIG. 8 is a schematic perspective view of a circuit device including electronic components attached to the heat sink in FIG. 5.
Figure 9:
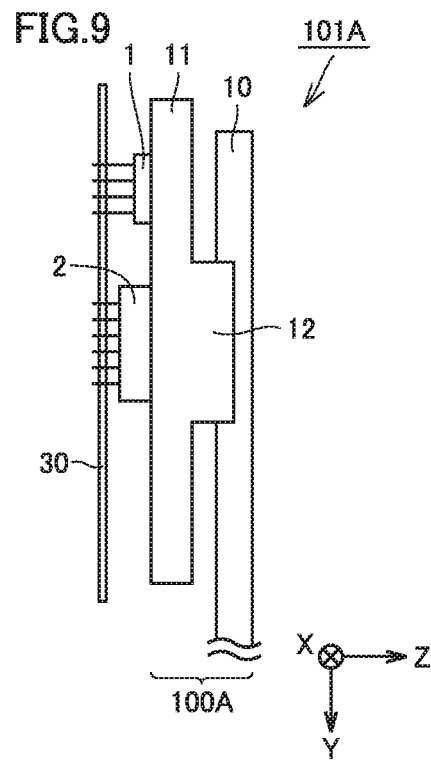
FIG. 9 is a schematic front view of the circuit device in FIG. 8 mounted on a printed wiring board, viewed from a direction indicated by an arrow IX.

FIG. 8 is a schematic perspective view of a circuit device including electronic components attached to the heat sink in FIG. 5. FIG. 9 is a schematic front view of the circuit device in FIG. 8 mounted on a printed wiring board, viewed from a direction indicated by an arrow IX. Referring to FIGS. 8 and 9, as described above, heat sink 100A has the other main surface 14b as a first surface in which projection 12 is formed, and one main surface 14a as a second surface opposite to the other main surface 14b, with respect to a direction along the XY plane. A circuit device 101A as circuit device 101 in the present embodiment includes heat sink 100A and electronic components described later. In circuit device 101A, heat sink 100A is preferably placed such that one main surface 14a faces upward in the Z direction and the other main surface 14b faces downward in the Z direction. On one main surface 14a, a diode module 1 and an IGBT module 2 as electronic components are attached. Diode module 1 includes rectifier diodes. IGBT module 2 includes IGBT (Insulated Gate Bipolar Transistor) elements.

IGBT module 2 as a first electronic component is placed on one main surface 14a of heat sink 100A such that at least a portion thereof overlaps with the region of projection 12 in plan view. It should be noted that the "plan view" used herein refers to a case where heat sink 100A is viewed from a direction perpendicular to one main surface 14a of heat sink 100A. However, diode module 1 as a second electronic component is placed on one main surface 14a of heat sink 100A to overlap with flat portion 13 in plan view. Diode module 1 and IGBT module 2 are fixed to one main surface 14a with screws as an example of a fixing member. However, diode module 1 and IGBT module 2 are preferably attached to cooling block 11 via a heat dissipation interface such as a heat dissipation sheet or grease. This can reduce a contact thermal resistance between heat sink 100A and each of diode module 1 and IGBT module 2.

As shown in FIG. 9, diode module 1 and IGBT module 2 are mounted on a printed wiring board 30 arranged to planarly overlap with heat sink 100A.

Figure 10:
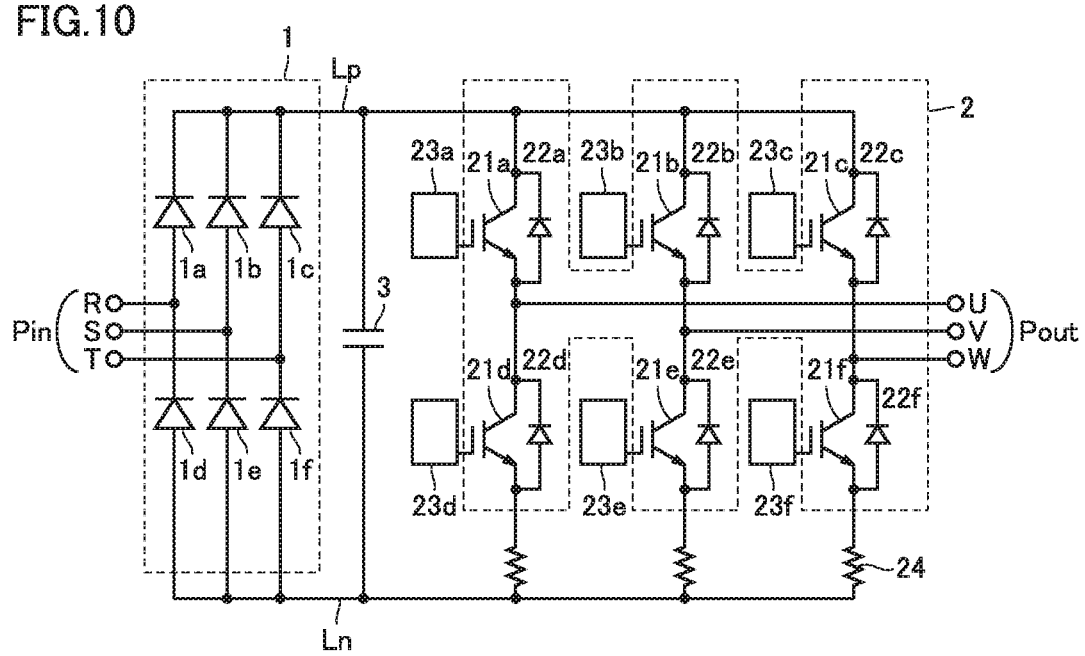
FIG. 10 is a circuit diagram of an inverter device embedded in a control device including the electronic components in FIGS. 8 and 9 (an electronic component in FIG. 1).

FIG. 10 is a circuit diagram of an inverter device embedded in control device 240 (see FIG. 1) including the electronic components in FIGS. 8 and 9 (electronic component 120 in FIG. 1). Referring to FIG. 10, the inverter device includes an input power supply $P_{in}$, a rectifier circuit including diode module 1, a smoothing capacitor 3, an inverter circuit including IGBT module 2, and an output power supply $P_{out}$. Input power supply $P_{in}$ has three phases, i.e., an R phase, an S phase, and a T phase. In addition, output power supply $P_{out}$ has three phases, i.e., a U phase, a V phase, and a W phase. Rectifier diodes 1a to 1f constituting diode module 1 are connected to the R phase, the S phase, and the T phase. Specifically, rectifier diode 1a and rectifier diode 1d are connected in series with each other, and an R phase terminal is connected therebetween. In addition, rectifier diode 1b and rectifier diode 1e are connected in series with each other, and an S phase terminal is connected therebetween. In addition, rectifier diode 1c and rectifier diode 1f are connected in series with each other, and a T phase terminal is connected therebetween. Rectifier diodes 1a, 1b, and 1c are connected in series with cathode sides of rectifier diodes 1d, 1e, and 1f, respectively. Rectifier diodes 1a and 1d, rectifier diodes 1b and 1e, and rectifier diodes 1c and 1f are connected in parallel with one another.

A negative line Ln is connected to anode sides of rectifier diodes 1a to 1f of diode module 1, and a positive line Lp is connected to cathode sides thereof. Smoothing capacitor 3 is connected in parallel to rectifier diodes 1a to 1f to connect negative line Ln and positive line Lp.

As shown in FIG. 10, IGBT module 2 is constituted by elements including six pairs of IGBT elements 21a to 21f and reflux diodes 22a to 22f respectively connected in parallel. The pair of IGBT element 21a and reflux diode 22a and the pair of IGBT element 21d and reflux diode 22d are connected in series with each other, and a U phase terminal is connected therebetween. In addition, the pair of IGBT element 21b and reflux diode 22b and the pair of IGBT element 21e and reflux diode 22e are connected in series with each other, and a V phase terminal is connected therebetween. In addition, the pair of IGBT element 21c and reflux diode 22c and the pair of IGBT element 21f and reflux diode 22f are connected in series with each other, and a W phase terminal is connected therebetween. IGBT elements 21a and 21d, IGBT elements 21b and 21e, and IGBT elements 21c and 21f are connected in parallel with one another.

A series circuit including IGBT elements 21a and 21d switches the U phase. A series circuit including IGBT elements 21b and 21e switches the V phase. A series circuit including IGBT elements 21c and 21f switches the W phase. The U phase terminal, the V phase terminal, and the W phase terminal of a load, which is a motor, for example, are respectively connected to the U phase, the V phase, and the W phase of output power supply $P_{out}$.

It should be noted that drive signals are individually supplied from a plurality of drive circuits 23a to 23f to gates and emitters of IGBT elements 21a to 21f, respectively. Drive circuits 23a to 23f each include a photocoupler for optical insulation. Drive circuits 23a to 23f receive a control signal from an external control circuit such as a microprocessor, output individual drive signals, and supply the drive signals to the gates and the emitters of IGBT elements 21a to 21f, respectively.

Shunt resistors 24 for sensing currents flowing to the U phase terminal, the V phase terminal, and the W phase terminal are respectively connected between the emitters of IGBT elements 21d, 21e, and 21f and negative line Ln.

In the circuit in FIG. 10, as a whole, diode module 1, smoothing capacitor 3, and IGBT elements 21a to 21f and the like are connected in order from the input power supply $P_{in}$ side toward the output power supply $P_{out}$ side.

Figure 11:
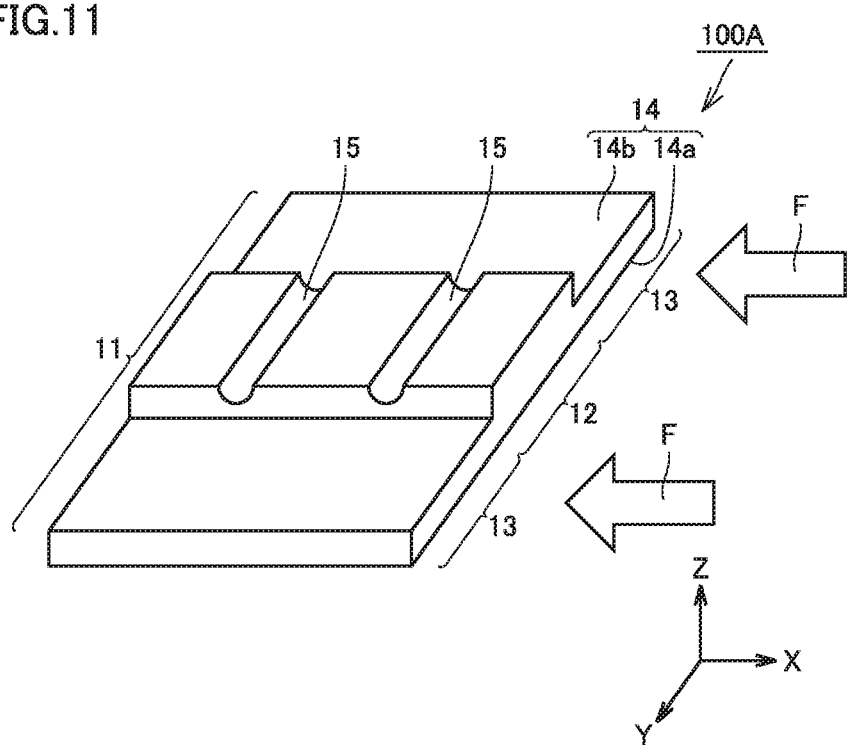
FIG. 11 is a schematic view showing a method for manufacturing the heat sink in accordance with the first embodiment.

Heat sink 100A in the present embodiment described above is manufactured as described below. FIG. 11 is a schematic view showing a method for processing the shape of cooling block 11, in particular, of heat sink 100A in accordance with the first embodiment. Referring to FIG. 11, to manufacture cooling block 11 of heat sink 100A, extrusion processing is performed by placing a metal member formed in a flat plate shape within a die with die holes having a cross sectional shape in a YZ plane of heat sink 100A, and applying a force F indicated by an arrow from a positive side in the X direction, for example. Preferably, force F is applied in particular on the front side and the back side in the Y direction of the metal member. Thereby, in regions to which the force is applied, the metal material on the other main surface 14b side, in particular, is removed to be moved to a negative side in the X direction. Thereby, in the regions from which the metal member is removed, there are formed flat portions 13 having a height in the Z direction lower than that of the other region. Conversely, in the region other than the regions from which the metal member is removed, there is formed projection 12 having a relatively large dimension in the Z direction when compared with the regions from which the metal member is removed. Due to force F applied in the X direction during the extrusion processing, in the regions of flat portions 13, the force is applied entirely in the X direction and the material is extruded. Accordingly, flat portions 13 and projection 12 are formed entirely with respect to the X direction of cooling block 11.

It should be noted that the processing method for forming projection 12 is not limited to the extrusion processing described above. However, the extrusion processing can reduce processing cost.

After projection 12 is formed, groove portions 15 are formed in the other main surface 14b at projection 12 to extend along the Y direction intersecting (for example, orthogonal to) the direction of force F applied during the extrusion processing. Groove portions 15 are formed by performing cutting on projection 12.

Figure 12:
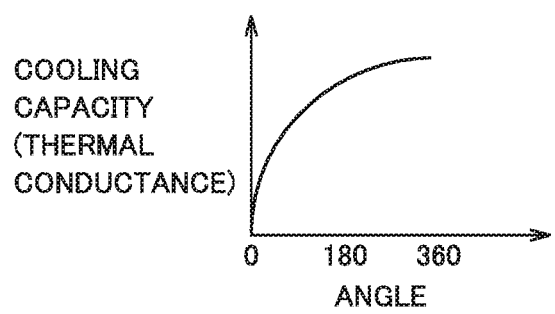
FIG. 12 is a graph showing the relation between an angle forming an arc of a cross section of a groove portion formed in a projection and cooling capacity of a pipe.

In FIGS. 2 and 4, the arc shape formed by the cross section of each groove portion 15 intersecting the direction in which it extends has a semicircular shape. Namely, an angle forming an arc of the cross section of groove portion 15 with respect to the center of a circular shape is 180°. The angle forming the arc is preferably more than or equal to 180° and less than or equal to 360°. FIG. 12 is a graph showing this.

In FIG. 12, the axis of abscissas represents the angle forming the arc shape formed by the cross section of each groove portion 15 intersecting the direction in which it extends, and the axis of ordinates represents the level of cooling capacity by pipe 10 placed in groove portions 15. Referring to FIG. 12, cooling capacity increases with an increase in the angle forming the arc as each groove portion 15. This is because the contact area between pipe 10 and groove portions 15 increases with an increase in the angle described above.

Next, the function and effect of the present embodiment will be described.

Heat sink 100A in the present embodiment includes pipe 10 through which the refrigerant flows, and cooling block 11. At least one projection 12 is formed in cooling block 11, and pipe 10 is in contact with projection 12. Pipe 10 is arranged with a spacing from flat portions 13, which are portions of cooling block 11 other than projection 12.

Accordingly, in cooling block 11, projection 12 in particular serves as a region which is more likely to be cooled because it is in contact with pipe 10, whereas flat portions 13 serve as regions which are less likely to be cooled because they are not in contact with pipe 10. Namely, a cooling amount can be adjusted by providing heat sink 100A with both projection 12 which is more likely to be cooled and flat portions 13 which are less likely to be cooled. Therefore, condensation in heat sink 100A due to overcooling can be suppressed.

The regions from which the metal member is extruded and removed for forming projection 12 in the extrusion processing during processing of cooling block 11 can be adjusted by adjusting the shape of the die holes in the die used for the extrusion processing. Hence, the contact area between pipe 10 and projection 12 can be easily adjusted by adjusting the ratio of the region where projection 12 is formed to entire cooling block 11. Hence, cooling efficiencies for diode module 1 and IGBT module 2 can be adjusted by adjusting the contact area.

It should be noted that, since cooling block 11 has flat portions 13, cooling block 11 has a heat capacity provided by flat portions 13. This can reduce a change in the temperature of projection 12, when compared with a case where cooling block 11 does not have flat portions 13, for example.

In addition, the region where pipe 10 is in contact with cooling block 11 is limited to projection 12 of cooling block 11. This can suppress occurrence of condensation resulting from overcooling in a region of cooling block 11 which is distant from a heat generation source such as diode module 1 and IGBT module 2. In addition, pipe 10 is arranged to be spaced and keep a certain distance from the portions of cooling block 11 other than the projection, to be substantially parallel to the portions. This suppresses a physical interference between pipe 10 and cooling block 11.

Groove portions 15 extending along one direction in plan view (the Y direction in FIG. 2) are formed in projection 12, and pipe 10 is fitted in groove portions 15 and is in contact with projection 12. Thereby, pipe 10 can be fixed to easily come into contact with the region where projection 12 is formed.

The dimension of projection 12 in the one direction (the Y direction in FIG. 2) is shorter than the dimension of cooling block 11 in the Y direction. Thus, when pipe 10 extending along the one direction planarly overlaps with entire cooling block 11 in the Y direction, a portion thereof is in contact with projection 12, i.e., cooling block 11, and other portions thereof overlap with flat portions 13 (i.e., are not in contact with cooling block 11). Accordingly, heat sink 100A capable of suppressing overcooling as described above can be provided.

Cooling block 11 has the other main surface 14b in which projection 12 is formed, and one main surface 14a opposite thereto, and circuit device 101A is formed by attaching the electronic components to one main surface 14a. Since one main surface 14a does not include projection 12 and is flat in its entirety, the electronic components can be easily and stably attached thereto.

Of the electronic components including IGBT module 2 and diode module 1, IGBT module 2 has a heat generation amount during driving larger than that of diode module 1. Thus, preferably, at least a portion of IGBT module 2 overlaps with the region of projection 12 in plan view, and diode module 1 overlaps with flat portion 13 in plan view.

Thereby, at least a portion of IGBT module 2 is fixed to a region closer to projection 12 where pipe 10 through which the refrigerant flows is fixed. Thus, IGBT module 2 having a heat generation amount larger than that of diode module 1 can be efficiently cooled in the region which planarly overlaps with projection 12.

On the other hand, diode module 1 does not overlap with projection 12 to which pipe 10 is joined, in plan view. Thus, diode module 1 is arranged at a position which is more distant from projection 12 than IGBT module 2. Therefore, diode module 1 is less likely to be cooled than IGBT module 2. However, no problem arises because diode module 1 has a heat generation amount smaller than that of IGBT module 2.

Rather, the following effect is exhibited by arranging diode module 1 in flat portion 13 spaced from pipe 10 and decreasing cooling efficiency. Generally, rectifier diodes $1a$ to $1f$ (see FIG. 10) included in diode module 1 have a forward voltage with a negative temperature coefficient. Thus, the forward voltage decreases when rectifier diodes $1a$ to $1f$ are less likely to be cooled and the temperature thereof increases. Hence, forward power loss generated by the product of a forward direction current and the forward voltage decreases as the temperature of rectifier diodes $1a$ to $1f$ increases. This can improve the efficiency of diode module 1.

As for IGBT module 2 as the first electronic component, it is only necessary that at least a portion thereof overlaps with the region of projection 12 in plan view. Namely, the other portion of IGBT module 2 may not overlap with the region of projection 12 in plan view, and may overlap with flat portion 13 in plan view, for example. However, IGBT module 2 preferably has a plane area smaller than the plane area of projection 12 in plan view. With such a configuration, IGBT module 2 having a large heat generation amount can be placed to entirely overlap with projection 12 in plan view. Thus, IGBT module 2 having a large heat generation amount can be cooled more highly efficiently.

In the description of the first embodiment described above, the inverter device that converts input power supply $P_{in}$ having three phases (the R phase, the S phase, the T phase) into output power supply $P_{out}$ having three phases (the U phase, the V phase, the W phase) is illustrated in FIG. 10. However, the present embodiment is also applicable to other various converters or various inverters.

Second Embodiment

Figure 13:
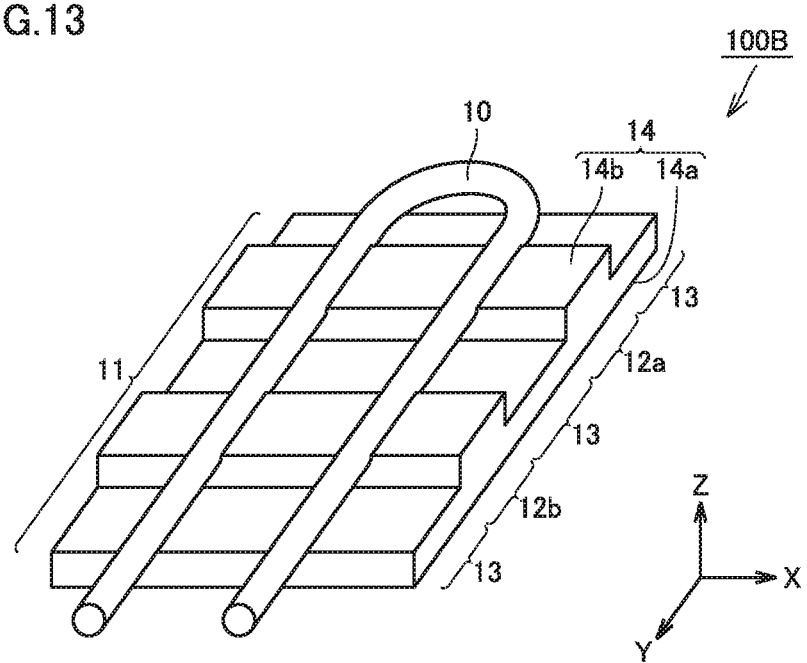
FIG. 13 is a schematic perspective view of an entire heat sink in accordance with a second embodiment.

FIG. 13 is a schematic perspective view of an entire heat sink 100B in accordance with a second embodiment. Referring to FIG. 13, heat sink 100B as heat sink 100 in the present embodiment has substantially the same configuration as that of heat sink 100A in the first embodiment shown in FIG. 5, and the manufacturing method therefor is also substantially the same as that for heat sink 100A. Accordingly, components in FIG. 13 identical to those in FIG. 5 will be designated by the same reference numerals, and the description thereof will not be repeated. However, in cooling block 11 of heat sink 100B in FIG. 13, a plurality of (two) projections 12 are formed with a spacing therebetween. The respective projections are referred to herein as a projection $12a$ and a projection $12b$. It should be noted that the number of projections 12 is not limited to two, but may be three or more. In addition, the plurality of projections $12a$ and $12b$ may have the same shape or may have different shapes. For example, the width of projection $12a$ in the Y direction may be different from the width of projection $12b$ in the Y direction. Projections $12a$ and $12b$ of heat sink 100B are formed entirely in the X direction of cooling block 11, as with projection 12 of heat sink 10A. In addition, groove portions 15 (not shown) are formed in each of projections $12a$ and $12b$. Pipe 10 for the refrigerant is fitted in groove portions 15 in each of projections $12a$ and $12b$ to be in contact therewith.

Further, projections $12a$ and $12b$ of heat sink 100B are formed with a spacing therebetween with respect to the Y direction. Although the plurality of (two) projections $12a$ and $12b$ preferably extend in directions substantially parallel to each other, the configuration thereof is not limited thereto. In this regard, cooling block 11 of heat sink 100B in the present embodiment is different from cooling block 11 of heat sink 100A having only one projection $12a$, $12b$ formed therein.

Figure 14:
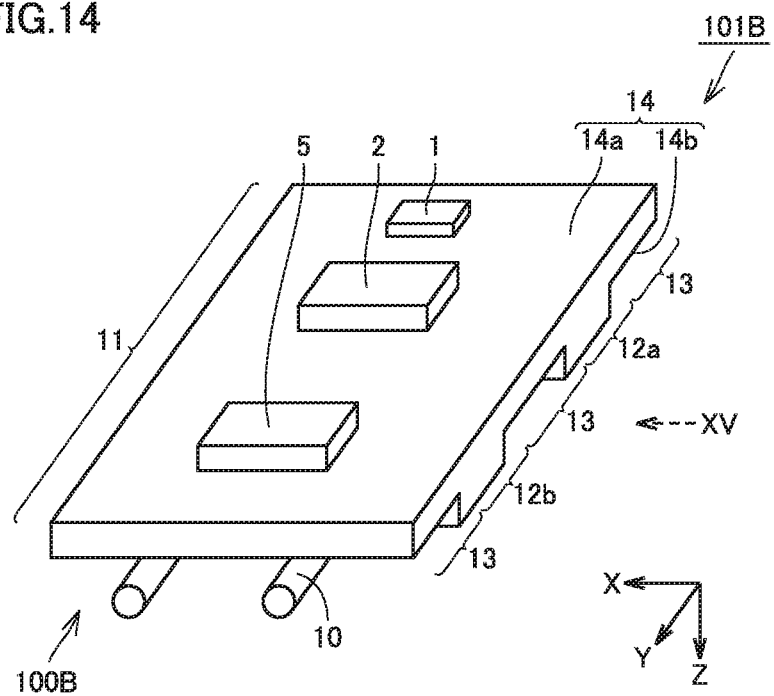
FIG. 14 is a schematic perspective view of a circuit device including electronic components attached to the heat sink in FIG. 13.
Figure 15:
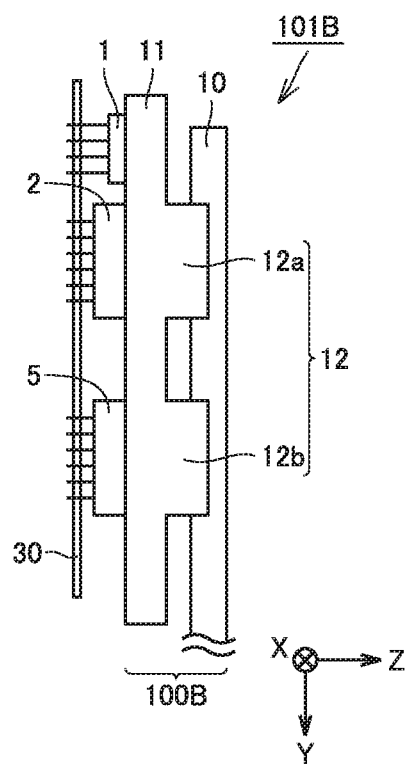
FIG. 15 is a schematic front view of the circuit device in FIG. 14 mounted on a printed wiring board, viewed from a direction indicated by an arrow XV.

FIG. 14 is a schematic perspective view of a circuit device including electronic components attached to the heat sink in FIG. 13. FIG. 15 is a schematic front view of the circuit device in FIG. 14 mounted on a printed wiring board, viewed from a direction indicated by an arrow XV. Referring to FIGS. 14 and 15, as with heat sink 100A, heat sink 100B also has the other main surface $14b$ as the first surface in which projections $12a$ and $12b$ are formed, and one main surface $14a$ opposite to the other main surface $14b$, with respect to the direction along the XY plane. A circuit device 101B as circuit device 101 in the present embodiment includes heat sink 100B. On one main surface $14a$, a step-up module 5 is attached as an electronic component, in addition to diode module 1 and IGBT module 2.

IGBT module 2 and step-up module 5 as first electronic components are placed on one main surface $14a$ of heat sink 100B such that at least portions thereof overlap with the regions of projections 12 in plan view. In FIGS. 14 and 15, as an example, IGBT module 2 is attached to overlap with projection $12a$, and step-up module 5 is attached to overlap with projection $12b$. However, conversely, step-up module 5 may be attached to overlap with projection $12a$, and IGBT module 2 may be attached to overlap with projection $12b$. It should be noted that, also in the present embodiment, diode module 1 is placed on one main surface $14a$ of heat sink 100B to overlap with flat portion 13 in plan view, as in the first embodiment.

The manner of attaching diode module 1, IGBT module 2, and step-up module 5 is the same as that in the first embodiment. In addition, as shown in FIG. 15, diode module 1 and IGBT module 2 are mounted on printed wiring board 30 arranged to planarly overlap with heat sink 100B.

Figure 16:
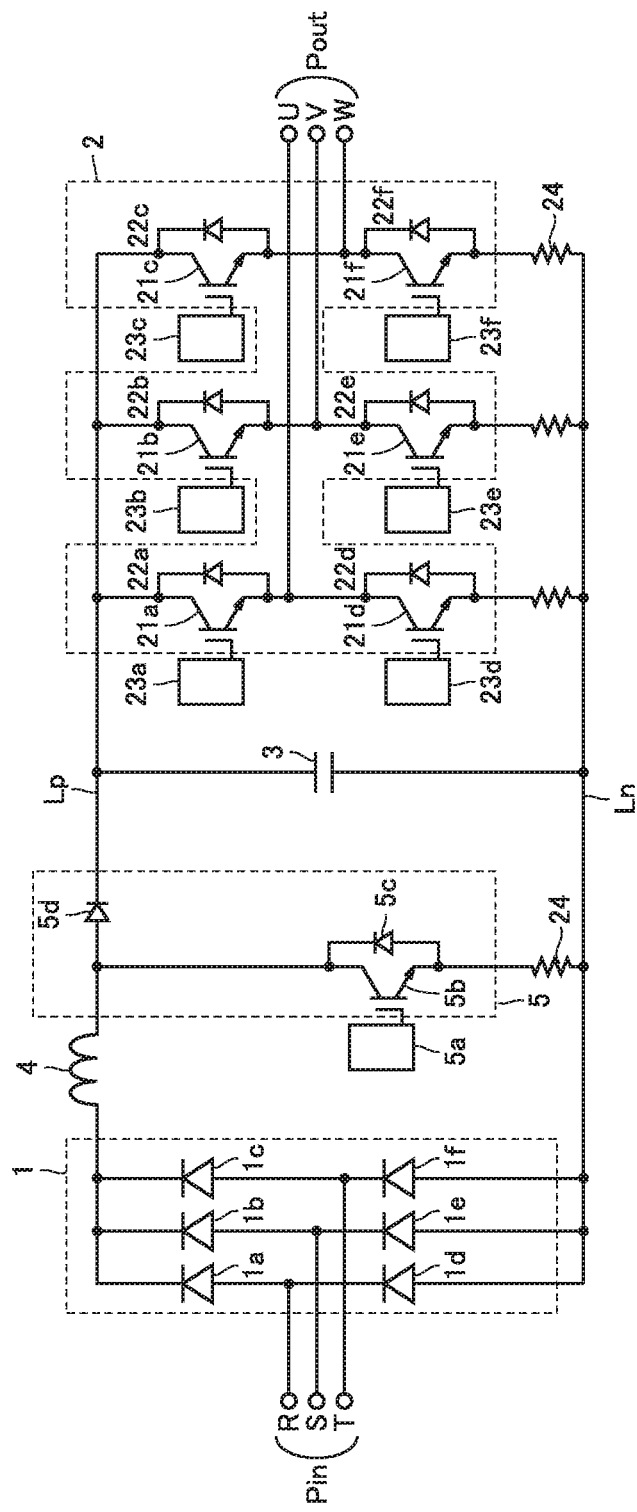
FIG. 16 is a circuit diagram of an inverter device embedded in a control device including the electronic components in FIGS. 14 and 15 (the electronic component in FIG. 1).

FIG. 16 is a circuit diagram of an inverter device embedded in control device 240 (see FIG. 1) including the electronic components in FIGS. 14 and 15 (electronic component 120 in FIG. 1). Referring to FIG. 16, in the inverter device in the present embodiment, a step-up circuit is further provided to the circuit of the inverter device in the first embodiment in FIG. 10. In FIG. 16, a reactor 4 and step-up module 5 are used as the step-up circuit. Reactor 4 is connected to cathode sides of rectifier diodes $1a$, $1b$, and $1c$ of diode module 1, that is, to positive line Lp.

Step-up module 5 has a drive circuit $5a$, an IGBT element $5b$, a reflux diode $5c$, and a diode $5d$. The manner of connecting drive circuit $5a$, IGBT element $5b$, and reflux diode $5c$ is the same as the manner of connecting drive circuits $23a$ to $23f$, IGBT elements $21a$ to $21f$, and reflux diodes $22a$ to $22f$ on an output side of smoothing capacitor 3. In addition, shunt resistor 24 for sensing currents flowing to the U phase terminal, the V phase terminal, and the W phase terminal is connected between an emitter of IGBT element 5b and negative line Ln.

The combination of drive circuit 5a, IGBT element 5b, and reflux diode 5c is connected in parallel to rectifier diodes 1a to 1f and smoothing capacitor 3 to connect negative line Ln and positive line Lp. On the other hand, diode 5d is a rectifier diode connected in series with reactor 4. In other words, diode 5d is connected to positive line Lp, as with reactor 4. Diode 5d has an anode side connected to reactor 4, and a cathode side connected to smoothing capacitor 3.

In the circuit in FIG. 16, as a whole, diode module 1, reactor 4, step-up module 5, smoothing capacitor 3, and IGBT elements 21a to 21f and the like are connected in order from the input power supply $P_{in}$ side toward the output power supply $P_{out}$ side.

The function and effect of the present embodiment are basically the same as the function and effect of the first embodiment. That is, pipe 10 is in contact with the plurality of (two) projections 12a and 12b, and pipe 10 is arranged with a spacing from flat portions 13. Thus, IGBT module 2 and step-up module 5 having larger heat generation amounts arranged to include regions which overlap with projections 12a and 12b in plan view can be highly efficiently cooled by the refrigerant flowing through pipe 10. On the other hand, by placing diode module 1 having a small heat generation amount to overlap with flat portion 13 in plan view, the cooling efficiency for diode module 1 is decreased, forward power loss is decreased, and thus the efficiency thereof can be improved.

Third Embodiment

Figure 17:
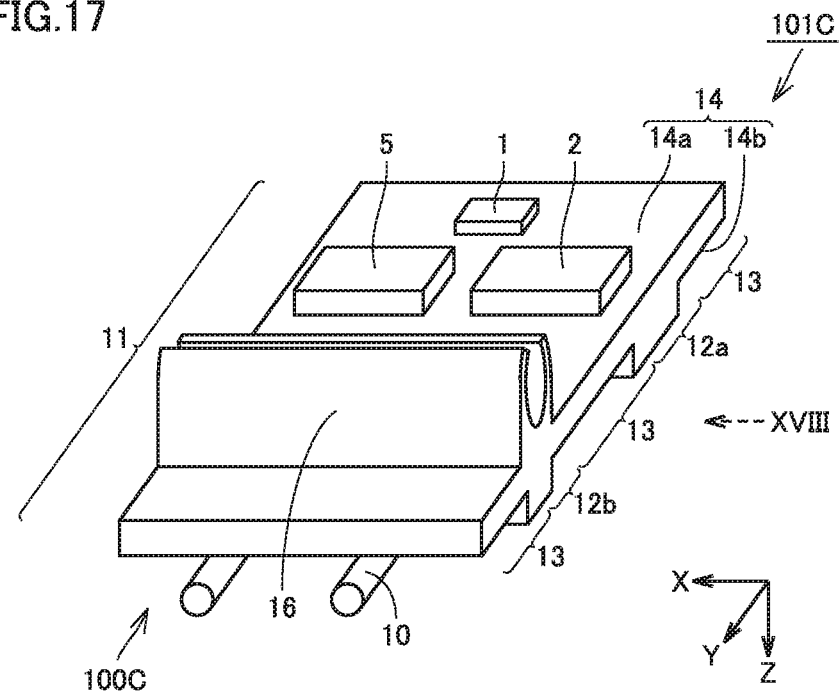
FIG. 17 is a schematic perspective view of a circuit device including electronic components attached to a heat sink in accordance with a third embodiment.
Figure 18:
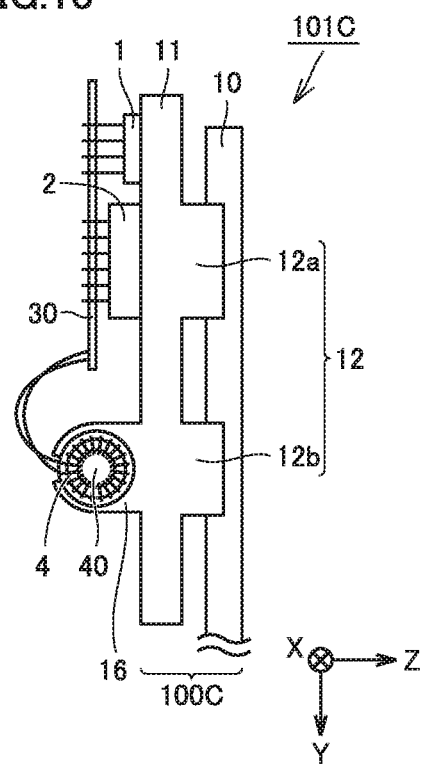
FIG. 18 is a schematic front view of the circuit device in FIG. 17 mounted on a printed wiring board, viewed from a direction indicated by an arrow XVIII.

FIG. 17 is a schematic perspective view of a circuit device including electronic components attached to a heat sink in accordance with a third embodiment. That is, FIG. 17 corresponds to FIG. 8 in the first embodiment and FIG. 14 in the second embodiment. FIG. 18 is a schematic front view of the circuit device in FIG. 17 mounted on a printed wiring board, viewed from a direction indicated by an arrow XVIII. Referring to FIGS. 17 and 18, a heat sink 100C as heat sink 100 in the present embodiment has substantially the same configuration as that of heat sink 100B in the second embodiment shown in FIG. 13. Accordingly, components in FIG. 17 identical to those in FIG. 13 will be designated by the same reference numerals, and the description thereof will not be repeated. However, in cooling block 11 of heat sink 100C in FIG. 17, an arc-shaped protrusion 16 is further provided at a portion of one main surface 14a. In this regard, heat sink 100C is different from heat sink 100B.

Arc-shaped protrusion 16 is a portion where one main surface 14a protrudes upward in the Z direction in FIG. 17. Arc-shaped protrusion 16 is formed entirely in the X direction of cooling block 11, as with projections 12a and 12b. Although arc-shaped protrusion 16 is formed to overlap with protrusion 12b in plan view in FIG. 17, arc-shaped protrusion 16 may be formed to overlap with protrusion 12a in plan view.

Preferably, arc-shaped protrusion 16 is also formed for example by extrusion processing, as with protrusions 12a and 12b. The cross section of arc-shaped protrusion 16 intersecting the direction in which it extends has an arc shape, and reactor 4 (see FIGS. 16 and 18) having a cylindrical shape, for example, can be arranged inside this arc-shaped portion.

A circuit device 101C as circuit device 101 in the present embodiment has substantially the same configuration as that of circuit device 101B in the second embodiment shown in FIGS. 14 and 15. Accordingly, components in FIGS. 17 and 18 identical to those in FIGS. 14 and 15 will be designated by the same reference numerals, and the description thereof will not be repeated. In circuit device 101C, diode module 1, IGBT module 2, and step-up module 5 as electronic components are placed, as with circuit device 101B. Diode module 1 is arranged to overlap with flat portion 13 in plan view. In contrast, both IGBT module 2 and step-up module 5 are arranged to include regions where at least portions thereof overlap with projection 12a in plan view. Diode module 1, IGBT module 2, and step-up module 5 are mounted on printed wiring board 30 arranged to planarly overlap with heat sink 100C.

As shown in FIG. 18, in circuit device 101C in FIG. 17, reactor 4 is arranged such that the surface thereof is in contact with the inside of the arc-shaped portion of arc-shaped protrusion 16. Wires of reactor 4 are drawn out from a slit on an upper side of arc-shaped protrusion 16 (a lower side in the Z direction in FIG. 18). The wires of reactor 4 are connected to printed wiring board 30. A main body portion of reactor 4 fixed by arc-shaped protrusion 16 has a configuration sealed with a resin sealing material 40. Thereby, the main body portion of reactor 4 can be fixed to come into contact with arc-shaped protrusion 16 of heat sink 100C made of a metal material. Resin sealing material 40 for sealing the main body portion of reactor 4 is made of an epoxy resin, a silicone resin, or the like.

The function and effect of the present embodiment are basically the same as the functions and effects of the first and second embodiments. In addition, in the present embodiment, reactor 4 can be easily integrated with cooling block 11 without additionally using a case for sealing reactor 4 with resin, by having the configuration described above. Thus, the effects of reducing the manufacturing cost of circuit device 101C and reducing thermal resistance due to integration of members can be achieved.

In addition, according to the present embodiment, since reactor 4 is in contact with heat sink 100C, heat of reactor 4 can be dissipated to heat sink 100C, and an increase in temperature thereof can be suppressed. Thus, reactor 4 can be downsized. It should be noted that the present embodiment illustrates an example where reactor 4 is accommodated in arc-shaped protrusion 16. However, the present embodiment is not limited thereto, and the same effect can be achieved also when a winding component such as a choke coil, for example, is used instead of reactor 4.

Fourth Embodiment

Figure 19:
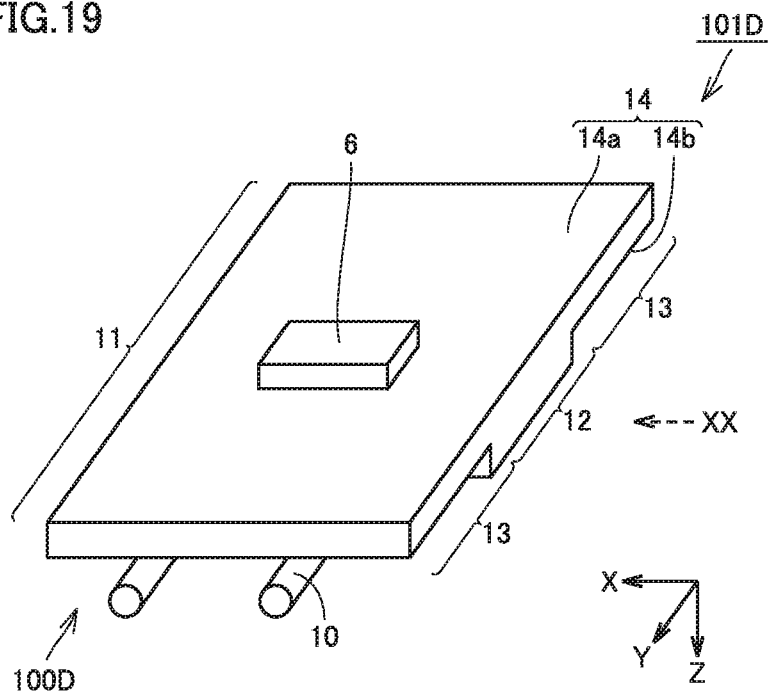
FIG. 19 is a schematic perspective view of a circuit device including an electronic component attached to a heat sink in accordance with a fourth embodiment.
Figure 20:
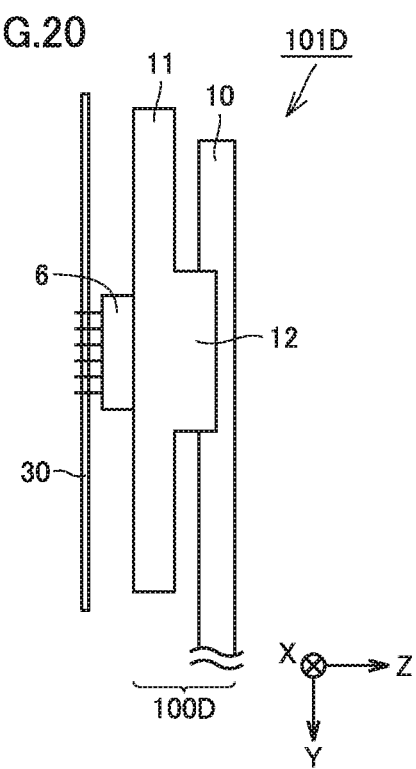
FIG. 20 is a schematic front view of the circuit device in FIG. 19 mounted on a printed wiring board, viewed from a direction indicated by an arrow XX.
Figure 21:
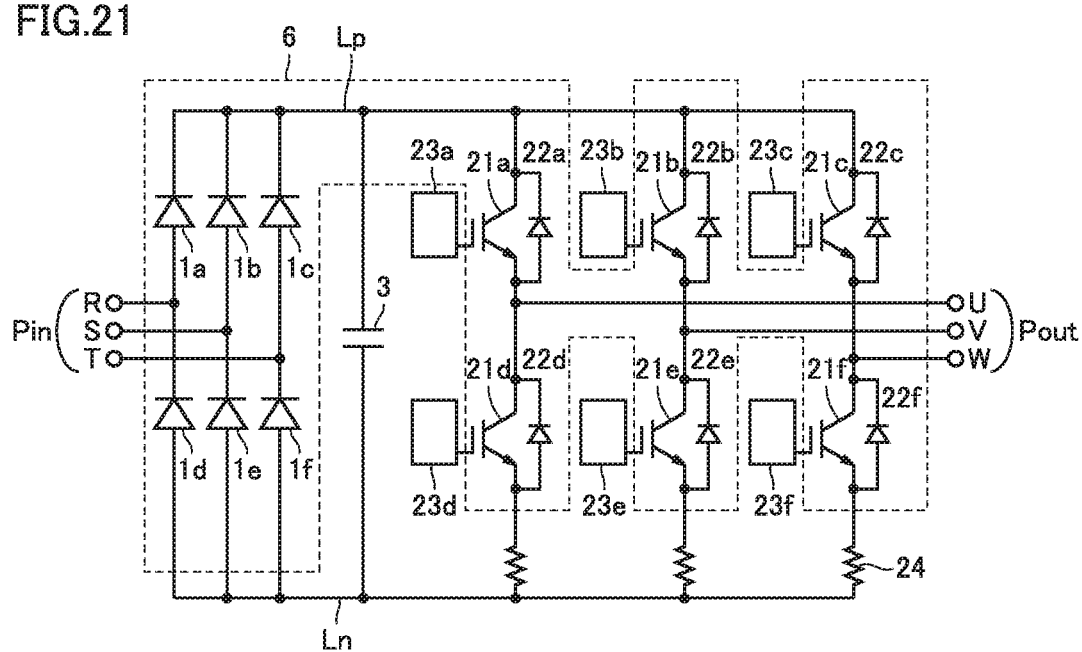
FIG. 21 is a circuit diagram of an inverter device embedded in a control device including the electronic component in FIGS. 19 and 20 (the electronic component in FIG. 1).

FIG. 19 is a schematic perspective view of a circuit device including an electronic component attached to a heat sink in accordance with a fourth embodiment. That is, FIG. 19 corresponds to FIG. 8 in the first embodiment, FIG. 14 in the second embodiment, and FIG. 17 in the third embodiment. FIG. 20 is a schematic front view of the circuit device in FIG. 19 mounted on a printed wiring board, viewed from a direction indicated by an arrow XX. FIG. 21 is a circuit diagram of an inverter device embedded in control device 240 (see FIG. 1) including the electronic component in FIGS. 19 and 20 (electronic component 120 in FIG. 1).

Referring to FIGS. 19, 20, and 21, a heat sink 100D as heat sink 100 in the present embodiment has substantially the same configuration as that of heat sink 100A in the first embodiment. Accordingly, components in FIG. 19 identical to those in FIG. 8 will be designated by the same reference numerals, and the description thereof will not be repeated. However, the electronic component placed in a circuit device 101D as circuit device 101 in FIG. 19 is a composite module 6. Composite module 6 is a module in which diode module 1 and IGBT module 2 in the first embodiment are combined and integrated. That is, composite module 6 includes rectifier diodes 1a to 1f, IGBT elements 21a to 21f, and reflux diodes 22a to 22f. Composite module 6 is directly mounted on printed wiring board 30.

With such a configuration, all elements are arranged in a region which planarly overlaps with projection 12 irrespective of the magnitude of the heat generation amount, and the effect of cooling them is improved. However, since projection 12 also exists at least in the present embodiment, adjustment such as reducing the contact area between projection 12 and pipe 10 can be performed, when compared with a case where projection 12 does not exist. Thus, also in the present embodiment, the cooling efficiencies for diode module 1 and IGBT module 2 can be adjusted by adjusting the contact area.

It should be noted that the above description illustrates an example where composite module 6 having diode module 1 and IGBT module 2 as in the first embodiment is used. However, in the present embodiment, composite module 6 may be applied to and formed in an example having the plurality of projections 12a and 12b and further having step-up module 5 as in the second and third embodiments.

Fifth Embodiment

Figure 22:
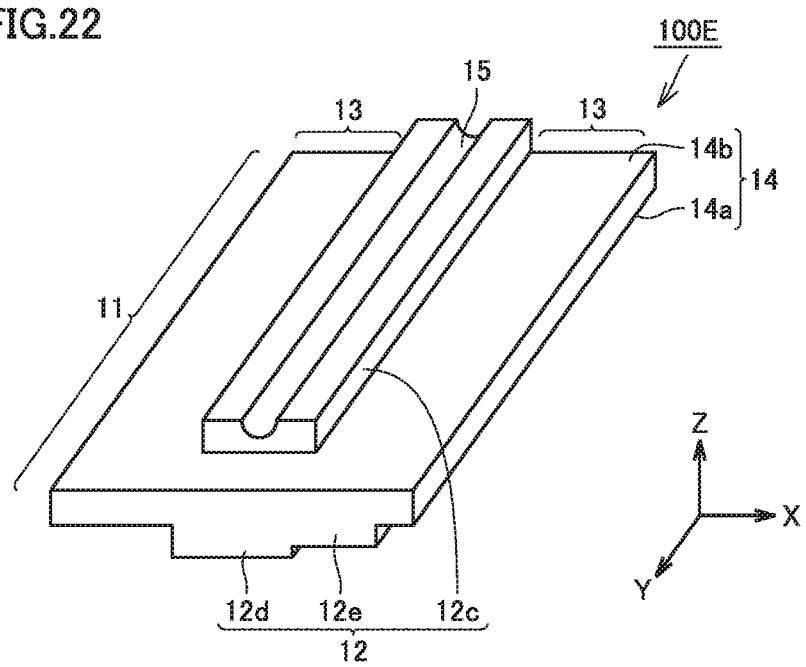
FIG. 22 is a schematic perspective view showing a manner in which a portion of a heat sink in accordance with a first example of a fifth embodiment is viewed from a first surface side.
Figure 23:
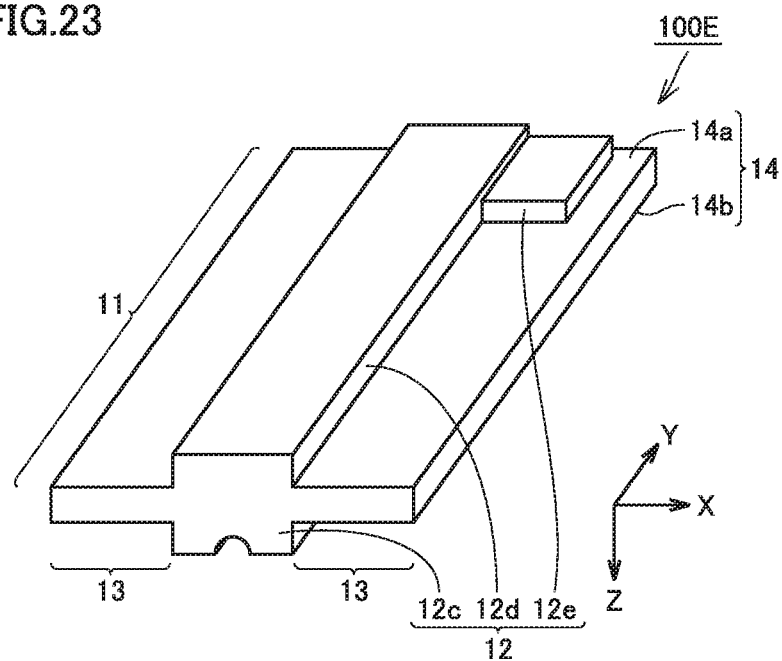
FIG. 23 is a schematic perspective view showing a manner in which the portion of the heat sink in accordance with the first example of the fifth embodiment is viewed from a second surface side.

FIG. 22 is a schematic perspective view showing a manner in which a portion of a heat sink in accordance with a first example of a fifth embodiment is viewed from a first surface side. FIG. 23 is a schematic perspective view showing a manner in which the portion of the heat sink in accordance with the first example of the fifth embodiment is viewed from a second surface side. Referring to FIGS. 22 and 23, the portion of cooling block 11 in a heat sink 100E as heat sink 100 in the first example of the present embodiment has substantially the same configuration as that in heat sink 100A in the first embodiment. Accordingly, components in FIGS. 22 and 23 identical to those of heat sink 100A in FIG. 5 will be designated by the same reference numerals, and the description thereof will not be repeated. However, in heat sink 100E in FIGS. 22 and 23, projection 12 is formed in each of the other main surface 14b as the first surface and one main surface 14a as the second surface. In heat sink 100E, projection 12 formed in one main surface 14a as the second surface includes a first projection and a second projection.

Specifically, in heat sink 100E, flat portion 13 as a portion of the other main surface 14b projects on a positive side in the Z direction to form a projection 12c as another portion of the other main surface 14b, as in the other embodiments described above. In addition, in heat sink 100E, flat portion 13 as a portion of one main surface 14a projects on a negative side in the Z direction to form projections 12d and 12e as other portions of one main surface 14a. Projection 12 formed in flat portion 13 of one main surface 14a includes projection 12d as the first projection and projection 12e as the second projection.

As shown in FIG. 22, in heat sink 100E, projection 12c is formed at a portion in the X direction, i.e., a central portion in the X direction, of cooling block 11. In addition, in heat sink 100E, projection 12c extends longer in the Y direction, when compared with heat sinks 100 in the other embodiments described above. However, also in heat sink 100E, the dimension of projection 12 in the Y direction, which is the one direction in plan view, is shorter than the dimension of entire cooling block 11 in the Y direction, as in the other embodiments. Thus, in FIG. 23, there is a region on the foremost side in the Y direction where projection 12c is not arranged and flat portion 13 connected to right and left flat portions 13 is arranged. In projection 12c, one groove portion 15 extending along the Y direction is formed such that only one of two portions extending in the Y direction of U-shaped pipe 10 extending in the Y direction is fitted therein.

As shown in FIG. 23, in heat sink 100E, projection 12d is formed at a portion in the X direction, i.e., a central portion in the X direction, of cooling block 11. In addition, in heat sink 100E, projection 12d is formed entirely in the Y direction of cooling block 11. However, the configuration of projection 12d is not limited to such a manner, and projection 12d may be formed at only a portion in the Y direction of cooling block 11.

On the other hand, in heat sink 100E, projection 12e is formed such that, in one main surface 14a, flat portion 13 to the right of projection 12d in the X direction partially projects, for example. The length for which projection 12e extends in the Y direction is shorter than the length for which projection 12d extends in the Y direction. However, the length of projection 12e in the Y direction may be equal to the length of projection 12d in the Y direction. In addition, the length for which projection 12e extends in the X direction may be shorter than, equal to, or longer than the length for which projection 12d extends in the X direction.

As shown in FIG. 23, projection 12d and projection 12e have different thicknesses with respect to a direction connecting the other main surface 14b and one main surface 14a, that is, the Z direction. Specifically, in FIG. 23, projection 12d is formed thicker than projection 12e with respect to the Z direction. It should be noted that projection 12c and projections 12d and 12e may have any size relation regarding thickness in the Z direction.

Figure 24:
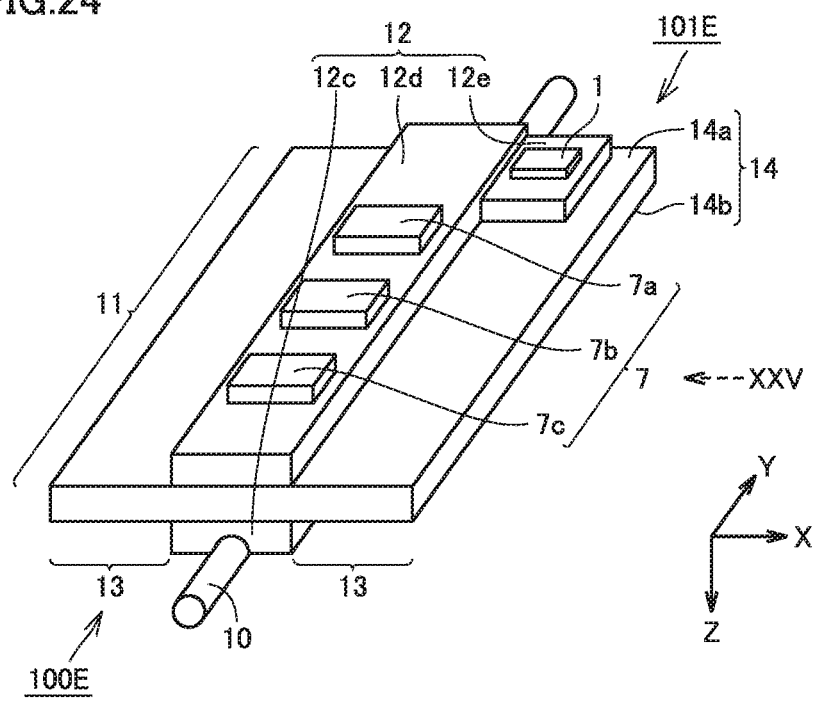
FIG. 24 is a schematic perspective view of a circuit device including electronic components attached to the heat sink in accordance with the first example of the fifth embodiment in FIG. 22 or 23.
Figure 25:
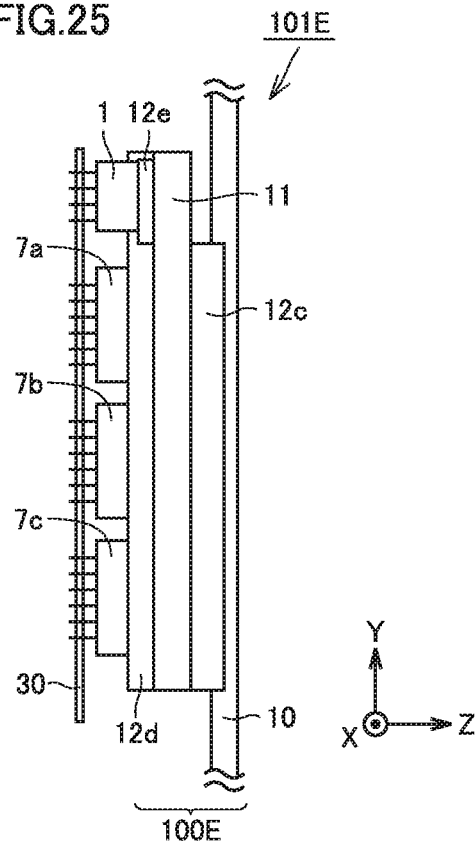
FIG. 25 is a schematic front view of the circuit device in FIG. 24 mounted on a printed wiring board, viewed from a direction indicated by an arrow XXV.
Figure 26:
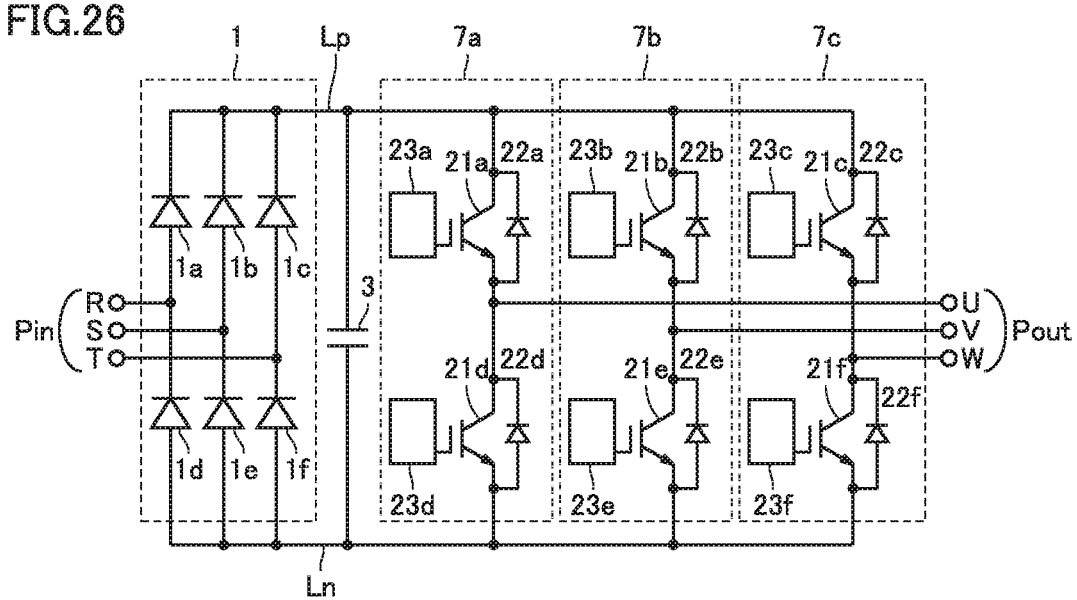
FIG. 26 is a circuit diagram of an inverter device embedded in a control device 240 (see FIG. 1) including the electronic components in FIGS. 24 and 25 (an electronic component 120 in FIG. 1).

FIG. 24 is a schematic perspective view of a circuit device including electronic components attached to the heat sink in accordance with the first example of the fifth embodiment in FIG. 22 or 23. That is, FIG. 24 corresponds to FIG. 8 in the first embodiment, FIG. 14 in the second embodiment, FIG. 17 in the third embodiment, and FIG. 19 in the fourth embodiment. FIG. 25 is a schematic front view of the circuit device in FIG. 24 mounted on a printed wiring board, viewed from a direction indicated by an arrow XXV. FIG. 26 is a circuit diagram of an inverter device embedded in control device 240 (see FIG. 1) including the electronic components in FIGS. 24 and 25 (electronic component 120 in FIG. 1).

Referring to FIGS. 24, 25, and 26, in the present embodiment, diode module 1 and an intelligent power module 7 are attached as electronic components. Specifically, intelligent power module 7 has intelligent power modules 7a, 7b, and 7c. Intelligent power modules 7a, 7b, and 7c are modules in which IGBT module 2 and drive circuits 23 in the first embodiment are combined and integrated.

Diode module 1 and intelligent power modules 7a, 7b, and 7c as electronic components are attached to one main surface 14a of heat sink 100E, and thereby a circuit device 101E as circuit device 101 in the present embodiment is formed. That is, in circuit device 101E, the above electronic components are attached on projections 12d and 12e in one main surface 14a of heat sink 100E.

More specifically, intelligent power module 7 as a first electronic component is attached to projection 12d in one main surface 14a. In addition, diode module 1 as a second electronic component is attached to projection 12e in one main surface 14a. However, attachment of the electronic components is not limited to such a manner, and conversely, intelligent power module 7 may be attached to projection 12e, and diode module 1 may be attached to projection 12d. In either case, in the present embodiment, one of the first electronic component and the second electronic component is preferably attached to projection 12d. In addition, in the present embodiment, the other one of the first electronic component and the second electronic component, which is different from the one, is preferably attached to projection 12e, which is different from projection 12d formed in one main surface 14a such that it projects. It should be noted that, as shown in FIG. 25, diode module 1 and intelligent power modules 7a, 7b, and 7c are directly mounted on printed wiring board 30.

As described above, in the present embodiment, a plurality of projections 12d and 12e are formed in one main surface 14a. Thereby, positions for placing the electronic components attached to circuit device 101E in the Z direction can be changed arbitrarily. Specifically, first, comparison is made between dimensions of diode module 1 and intelligent power module 7 in the Z direction. Here, when the dimension of diode module 1 in the Z direction is larger than the dimension of intelligent power module 7 (i.e., diode module 1 is thicker than intelligent power module 7), if diode module 1 and intelligent power module 7 are provided on the same projection, printed wiring board 30 interferes with thick diode module 1 as shown in FIG. 25. As a result, it is difficult to appropriately mount both diode module 1 and intelligent power module 7 on printed wiring board 30.

Accordingly, in the present embodiment, the plurality of projections 12d and 12e have different thicknesses in the Z direction. Thereby, thick diode module 1 can be attached to thin projection 12e, and thin intelligent power module 7 can be attached to thick projection 12d. With such a configuration, diode module 1 and intelligent power module 7 originally having different thicknesses are attached at different positions with respect to the Z direction. Thus, as shown in FIG. 25, the distance with respect to the Z direction from flat portion 13 in one main surface 14a to the upper surface of diode module 1 which is most distant from flat portion 13 can be substantially equal to the distance with respect to the Z direction from flat portion 13 in one main surface 14a to the upper surface of intelligent power module 7 which is most distant from flat portion 13. Thus, diode module 1 and intelligent power module 7 can be mounted on the same printed wiring board 30. Therefore, there is no need to mount thick diode module 1 and thin intelligent power module 7 on a plurality of divided printed wiring boards, respectively, for example.

In addition, also in the present embodiment, cooling efficiencies for diode module 1 and intelligent power module 7 can be adjusted by adjustment such as reducing the contact area between projection 12c and pipe 10, as in the other embodiments described above.

Figure 27:
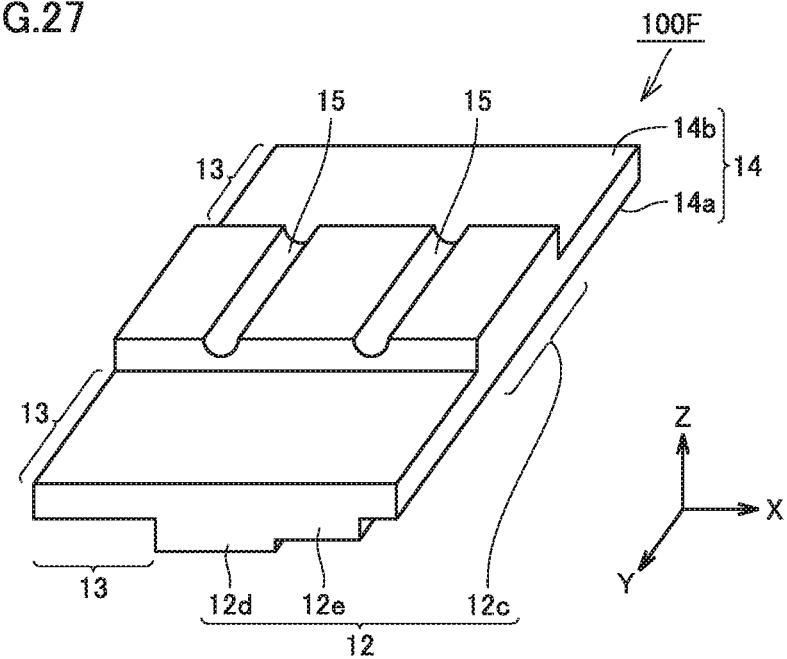
FIG. 27 is a schematic perspective view showing a manner in which a portion of a heat sink in accordance with a second example of the fifth embodiment is viewed from the first surface side.

FIG. 27 is a schematic perspective view showing a manner in which a portion of a heat sink in accordance with a second example of the fifth embodiment is viewed from the first surface side. Referring to FIG. 27, a heat sink 100F as heat sink 100 in the second example of the present embodiment has substantially the same configuration as that of heat sink 100E in the first example. Accordingly, components in FIG. 27 identical to those of heat sink 100E in FIG. 22 will be designated by the same reference numerals, and the description thereof will not be repeated. However, in heat sink 100F in FIG. 27, projection 12c formed in the other main surface 14b has the same manner as that of heat sink 100A in FIG. 2. That is, projection 12c is formed entirely in the X direction of cooling block 11. However, projection 12c is formed at only a central portion with respect to the Y direction of cooling block 11. Two groove portion 15 are formed in projection 12c with a spacing therebetween in the X direction such that both one and the other sides of pipe 10 extending in a U-shape can be fitted therein, the one and the other sides linearly extending to sandwich a curved portion of pipe 10 therebetween. On the other hand, projections 12d and 12e on the one main surface 14a side of heat sink 100F are the same as those in heat sink 100E. When an electronic component having a large heat generation is mounted at a position opposite to projection 12c, circuit device 101 may be formed using heat sink 100F having the configuration in FIG. 27.

Figure 28:
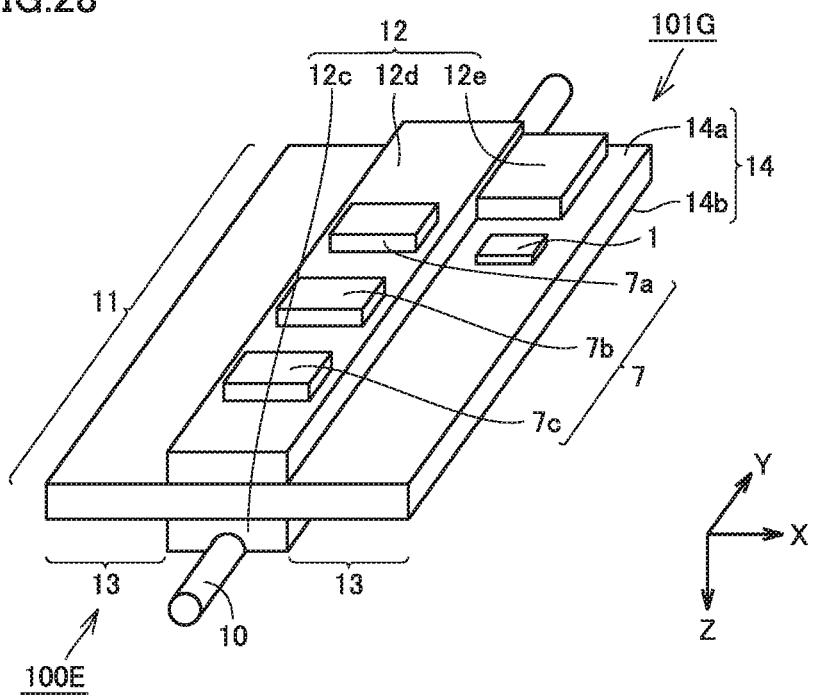
FIG. 28 is a schematic perspective view of a circuit device as a variation of the fifth embodiment relative to FIG. 24.

FIG. 28 is a schematic perspective view of a circuit device as a variation of the fifth embodiment relative to FIG. 24. Referring to FIG. 28, a circuit device 101G in the variation has substantially the same configuration as that of circuit device 101E in the present embodiment in FIG. 24. Accordingly, components in FIG. 28 identical to those of circuit device 101E in FIG. 24 will be designated by the same reference numerals, and the description thereof will not be repeated. However, in circuit device 101G in FIG. 28, intelligent power module 7, which is one of the first electronic component and the second electronic component, is attached to projection 12d. On the other hand, the other of the first electronic component and the second electronic component, which is different from the one, is attached to a region on one main surface 14a other than projections 12d and 12e, that is, onto flat portion 13.

Also when intelligent power module 7 is provided as described above, the same function and effect as those in the fifth embodiment in FIG. 24 can be exhibited. When FIGS. 24 and 28 are summarized, in the present embodiment, the other of the first electronic component and the second electronic component, which is different from the one attached to projection 12d as the first projection, may be attached to either the second projection formed in the second surface that is the projection different from the first projection, or a region on the second surface other than the projection.

It should be noted that, although not shown, the first electronic component may be attached to projection 12e, and the second electronic component may be attached to flat portion 13.

The characteristics described in the embodiments described above may be applied by being combined as appropriate within a technically consistent range.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1: diode module; 1a, 1b, 1c, 1d, 1e, 1f: rectifier diode; 2: IGBT module; 3: smoothing capacitor, 4: reactor, 5: step-up module; 5d: diode; 6: composite module; 7, 7a, 7b, 7c: intelligent power module; 11: cooling block; 12, 12a, 12b, 12c, 12d, 12e: projection; 13: flat portion; 14: main surface; 14a: one main surface; 14b: the other main surface; 15: groove portion; 16: arc-shaped protrusion; Sb, 21a, 21b, 21c, 21d, 21e, 21f: IGBT element; 5c, 22a, 22b, 22c, 22d, 22e, 22f: reflux diode; 5a, 23a, 23b, 23c, 23d, 23e, 23f: drive circuit; 24: shunt resistor, 30: printed wiring board; 40: resin sealing material; 100, 100A, 100B, 100C, 100D, 100E, 100F: heat sink; 101, 101A, 101B, 101C, 101D, 101E, 101G: circuit device; 110: temperature sensor, 120: electronic component; 200: heat source unit; 201: high pressure pipe; 202: low pressure pipe; 210: main circuit; 211: compressor, 212: flow path switching device; 213: heat source-side heat exchanger, 220: bypass circuit; 221: bypass pipe; 222: pre-cooling heat exchanger; 223: flow rate adjusting device; 230: cooling controller; 240: control device; 300: load unit; 301: load-side throttle device; 302: load-side heat exchanger; 400: air conditioner.

The invention claimed is:

1. A heat sink comprising:
a pipe through which refrigerant flows, the refrigerant is cooled by a heat exchanger, the pipe having a first width; and
a cooling block having a first surface and a second surface opposite to the first surface in a thickness direction,
at least one projection being formed in the first surface of the cooling block, the projection having a length parallel to the pipe and a width perpendicular to its length and perpendicular to the thickness direction, and in the first surface of the cooling block, a portion of the cooling block other than the projection is formed adjacently on at least one side of the projection
the pipe being in contact with the projection,
the pipe being arranged to be spaced and keep a distance from the portion of the cooling block other than the projection and wherein a distance from the pipe to a closest edge of the at least one projection in a width direction of the projection is greater than or equal to the first width.

2. The heat sink according to claim 1, wherein
a groove portion extending along one direction of the projection in plan view is formed in the projection, and
the pipe is fitted in the groove portion and is in contact with the projection.

3. The heat sink according to claim 2, wherein a dimension of the projection in the one direction is shorter than a dimension of the cooling block in the one direction.

4. A circuit device comprising:
the heat sink according to claim 1; and
a first electronic component,
the first electronic component being attached to the second surface.

5. The circuit device according to claim 4, comprising:
a second electronic component, wherein
at least a portion of the first electronic component, overlaps with a region of the cooling block having the projection, in plan view, and
the second electronic component, overlaps with a region of the cooling block other than the region having the projection, in plan view.

6. The circuit device according to claim 5, wherein the first electronic component has a heat generation amount larger than that of the second electronic component.

7. The circuit device according to claim 5, wherein the first electronic component has a plane area smaller than a plane area of the projection in plan view.

8. A circuit device, comprising:
a heat sink including:
a pipe through which refrigerant flows, the refrigerant is cooled by a heat exchanger, and
a cooling block having a first surface and a second surface opposite to the first surface,
at least one projection being formed in the first surface of the cooling block,
the pipe being in contact with the projection,
the pipe being arranged to be spaced and keep a distance from a portion of the cooling block other than the projection; and
an electronic component,
the electronic component being attached to the second surface,
the electronic component includes a first electronic component and a second electronic component,
at least a portion of the first electronic component overlaps with a region of the projection in plan view, and
the second electronic component overlaps with a region other than the projection in plan view, wherein
the projection is formed in each of the first surface and the second surface,
the projection formed in the second surface includes a first projection and a second projection, and
the first projection and the second projection have different thicknesses with respect to a direction connecting the first surface and the second surface.

9. The circuit device according to claim 8, wherein
one of the first electronic component and the second electronic component is attached to the first projection, and
the other of the first electronic component and the second electronic component, which is different from the one, is attached to either the second projection formed in the second surface that is the projection different from the first projection, or a region on the second surface other than the projection.

10. The circuit device according to claim 1, wherein the portion of the cooling block other than the projection is formed to sandwich the projection therebetween from both the one side and an other side of the projection.

* * * * *